United States Patent [19]
Naitou et al.

[11] Patent Number: 5,297,158
[45] Date of Patent: Mar. 22, 1994

[54] SEMICONDUCTOR LASER DEVICE INCLUDING A GALLIUM-ALUMINUM ARSENIC COMPOUND

[75] Inventors: Hiroki Naitou, Suita; Masahiro Kume, Otsu; Issei Ota, Fujiidera; Hirokazu Shimizu, Suita, all of Japan

[73] Assignee: Matsushita Electric Industrial Co., Ltd., Osaka, Japan

[21] Appl. No.: 871,913

[22] Filed: Apr. 21, 1992

[30] Foreign Application Priority Data

| Apr. 22, 1991 | [JP] | Japan | 3-090510 |
| Jun. 19, 1991 | [JP] | Japan | 3-147427 |
| Dec. 5, 1991 | [JP] | Japan | 3-321679 |
| Dec. 12, 1991 | [JP] | Japan | 3-328522 |
| Dec. 12, 1991 | [JP] | Japan | 3-328525 |
| Dec. 13, 1991 | [JP] | Japan | 3-330196 |
| Jan. 7, 1992 | [JP] | Japan | 4-000610 |
| Feb. 12, 1992 | [JP] | Japan | 4-024902 |

[51] Int. Cl.$^5$ ................................. H01S 3/19
[52] U.S. Cl. ............................. 372/46; 372/45
[58] Field of Search ........................... 372/45, 46

[56] References Cited

U.S. PATENT DOCUMENTS

| 5,105,432 | 4/1992 | Murakami et al. | 372/46 |
| 5,161,167 | 11/1992 | Murakami et al. | 372/46 |
| 5,189,680 | 2/1993 | Kimura | 372/46 |

FOREIGN PATENT DOCUMENTS 6273687 9/1985 Japan .

OTHER PUBLICATIONS

S. Yamashita et al., IEEE Journal of Quantum Electronics, vol. 27, pp. 1544–1549, 6 Jun. 1991.
K. Oomie et al., Appl. Phys. Lett., 45, pp. 818–820 (15 Oct. 1984).
H. Narto et al., IEEE Journ. of Quantum Electronics, vol. 25, pp. 1495–1499 (6 Jun. 1989).
S. Takigawa et al., Appl. Phys. Lett., 51, pp. 1580–1581 (16 Nov. 1987).
M. Sakamoto et al., Appl. Phys. Lett. 52, pp. 2220–2221 (27 Jun. 1988).
D. F. Welch et al., Electronics Lett., vol. 26, pp. 757,758 (1990).
K. Tateoka et al., IEEE Journal of Quantum Electronics, vol. 27, pp. 1568–1573, 6 Jun. 1991.

Primary Examiner—James W. Davie
Attorney, Agent, or Firm—Ratner & Prestia

[57] ABSTRACT

In a semiconductor laser device, a $Ga_{1-y}Al_yAs$ cladding layer of a conduction type is provided on at least one principal plane of an active layer, while a $Ga_{1-z}Al_zAs$ current blocking layer of the other conduction type is provided on the cladding layer and has a stripe-like window. The AlAs mode fractions Y and Z has a relation, $Z > Y$. The semiconductor laser device has low noises and a low operating current value.

36 Claims, 21 Drawing Sheets

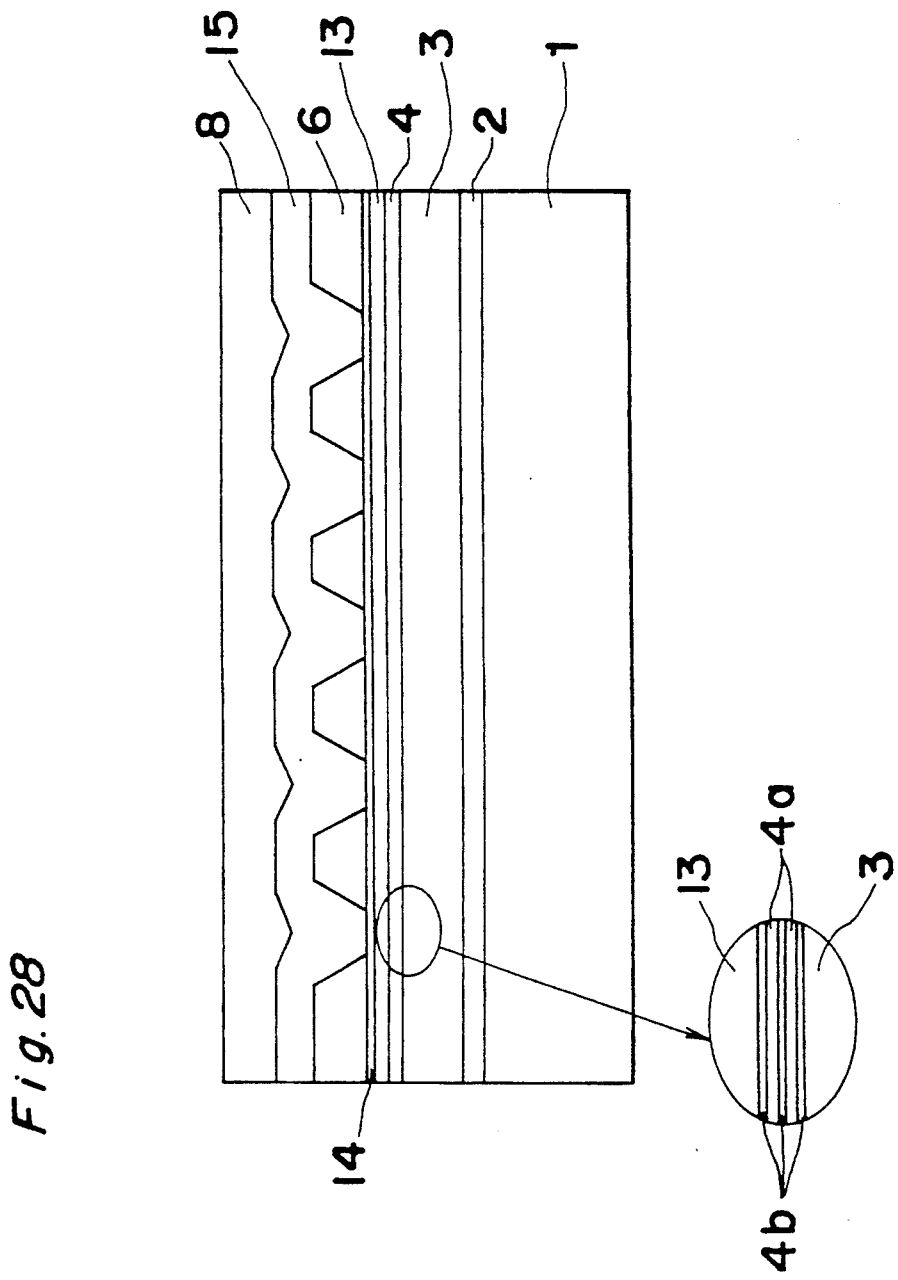

SEMICONDUCTOR LASER DEVICE INCLUDING A GALLIUM-ALUMINUM ARSENIC COMPOUND

BACKGROUND OF THE INVENTION

1. Field of the Invention

The present invention relates to a semiconductor laser device suitable for an optical source of an optical disc or the like.

2. Description of the Prior Art

In a prior art semiconductor laser (refer for example S. Yamashita et al., IEEE J. Quantum Electronics 27, 1544 (1991)), laser oscillation occurs in an active layer disposed between cladding layers, and one of the cladding layers has a ridge which is defined at the two sides by a current blocking layer for narrowing a current. In a structure of a semiconductor laser shown in FIG. 1, an n-type gallium arsenide (GaAs) buffer layer 22 is formed on an n-type GaAs substrate 21. Then, an n-type gallium aluminum arsenide $Ga_{0.5}Al_{0.5}As$ cladding layer 23, an active layer 24 and a p-type $Ga_{0.5}Al_{0.5}As$ cladding layer 25 are applied successively on the buffer layer 22. The p-type $Ga_{0.5}Al_{0.5}As$ cladding layer 25 has a ridge 25a which plays a role as a current channel to narrow a current, and a p-type GaAs protection layer 27 is formed on the ridge 25a. An n-type GaAs current blocking layer 26 is formed in an area except the ridge 25a. Further, a p-type GaAs contact layer 28 is applied to the protection layer 27 and to the current blocking layer 26.

FIG. 2 shows a similar prior art semiconductor laser device (refer for example K. Uomi et al., Appl. Phys. Lett. 45, 818 (1984)). An n-type gallium arsenide (GaAs) buffer layer 22, an n-type gallium aluminum arsenide $Ga_{0.5}Al_{0.5}As$ cladding layer 23, an active layer 24, a p-type $Ga_{0.5}Al_{0.5}As$ cladding layer 25' and an n-type GaAs current blocking layer 26 are applied successively to an n-type GaAs substrate 21 in a crystal growth process. Then, a stripe-like groove 29' is formed with etching, and a p-type $Ga_{0.5}Al_{0.5}As$ cladding layer 29 and a p-type GaAs contact layer 28 are formed in a regrowth process.

A current injected to the semiconductor lasers is confined in the ridge 25a or groove 29' effectively and the laser oscillation occurs in the active layer 24, while the generated light is confined effectively in the ridge or groove due to the optical absorption by the current blocking layer 26. In general, laser oscillation in the single lateral mode can be realized by making the stripe width, or the width of the ridge or groove at the lower end, to be about 5 μm.

In the semiconductor lasers, the threshold value and the efficiency of the laser oscillation is limited by the loss in the waveguide due to the optical absorption in the current blocking layer 26. Further, the spectra is liable to become a single mode because the laser light is confined sharply due to the optical absorption by the current blocking layer 26. Therefore, in order to realize multimode oscillation giving low noise operation, it is necessary to locate the current blocking layer 26 farther to some degree from the active layer 24. However, this enhances the leak current in the lateral directions below the ridge or groove, to increase the operating current.

Further, the stripe width cannot be so narrowed because the optical absorption by the current blocking layer 26 increases. Thus, the operating current cannot be lowered largely.

SUMMARY OF THE INVENTION

An object of the present invention is to provide a semiconductor laser device having low noises and a low operating current value.

In a semiconductor laser device according to the present invention, a $Ga_{1-Z}Al_ZAs$ layer of a conduction type having a stripe-like window is provided at least on a side of an active layer, and a $Ga_{1-Y}Al_YAs$ layer of the other conduction type than that of the $Ga_{1-Z}Al_ZAs$ layer is provided in a region except the window, wherein Z is larger than Y. In this structure, noises are lower and the operating current is lower largely than those of prior art. Because the AlAs mole fraction Z of the current blocking layer is higher than Y of the cladding layer in order to obtain a single lateral mode, laser light is not absorbed by the current blocking layer at all. Then, the loss in the waveguide can be decreased largely and the operating current can be decreased largely. Furthermore, the laser light is distributed in regions except the stripe so that the spectra is likely to become multimode giving low noises.

An advantage of the present invention is that the operating current and noises can be decreased.

BRIEF DESCRIPTION OF THE DRAWINGS

These and other objects and features of the present invention will become clear from the following description taken in conjunction with the preferred embodiments thereof with reference to the accompanying drawings, and in which:

FIG. 28 is a sectional view of another semiconductor laser device of array type according to Example 22;

DETAILED DESCRIPTION OF THE PREFERRED EMBODIMENTS

Example 1

Figure 3:
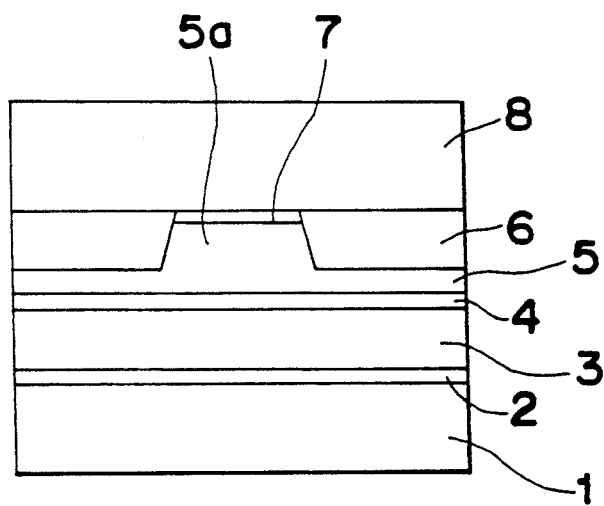
FIG. 3 is a sectional view of a semiconductor laser device.

Referring now to the drawings, wherein like reference characters designate like or corresponding parts, FIG. 3 shows an Example of a semiconductor laser device according the present invention. An n-type GaAs buffer layer 2 is formed on an n-type GaAs substrate 1, and an n-type $Ga_{0.5}Al_{0.5}As$ cladding layer 3, an $Ga_{0.85}Al_{0.15}As$ active layer 4 and a p-type $Ga_{0.5}Al_{0.5}As$ cladding layer 5 is applied successively on the buffer layer 2. The p-type $Ga_{0.5}Al_{0.5}As$ cladding layer 5 has a ridge 5a which plays a role as a current channel for narrowing a current, and a p-type GaAs protection layer 7 is formed on the ridge 5a. An n-type $Ga_{0.35}Al_{0.65}As$ current blocking layer 6 is formed in an area except the cladding ridge 5a. Further, a p-type GaAs contact layer 8 is applied to the protection layer 7 and the current blocking layer 6.

In order to realize stable single lateral mode oscillation, the AlAs mole fraction of the current blocking layer 6 is set to be higher by 10% or more than that of the p-type $Ga_{0.5}Al_{0.5}As$ cladding layer 5. In this Example, the AlAs mole fraction of the current blocking layer 6 is set to be 0.65 which is higher by 0.15 than that of the cladding layer 5. If the AlAs mole fraction of the current blocking layer 6 were the same as that of the p-type cladding layer 5, stable single lateral oscillation cannot be realized due to the plasma effect giving a decrease in the refractive index in the stripe. If the AlAs mole fraction of the current blocking layer 6 were lower than the p-type cladding layer 5, the lateral mode becomes unstable surely and even the lowering of the operation current cannot be realized.

In this structure, a current injected from the p-type GaAs contact layer 8 is confined in the ridge 5a, and the laser oscillation occurs in the $Ga_{0.85}Al_{0.15}As$ active layer 4 below the ridge 5a. Because the energy gap of the n-type $Ga_{0.35}Al_{0.65}As$ current blocking layer 6 is much larger than that of the $Ga_{0.85}Al_{0.15}As$ active layer 4, the current blocking layer 6 does not absorb laserlight in contrast to prior art semiconductor lasers. Then, the loss of waveguide can be decreased largely and the operating current can be lowered. Further, the light is distributed widely in regions except the stripe due to nonabsorbing-current blocking layer so that the spectra is easy to become multimode. Therefore, a semiconductor laser of low noises can be obtained.

Figure 1:
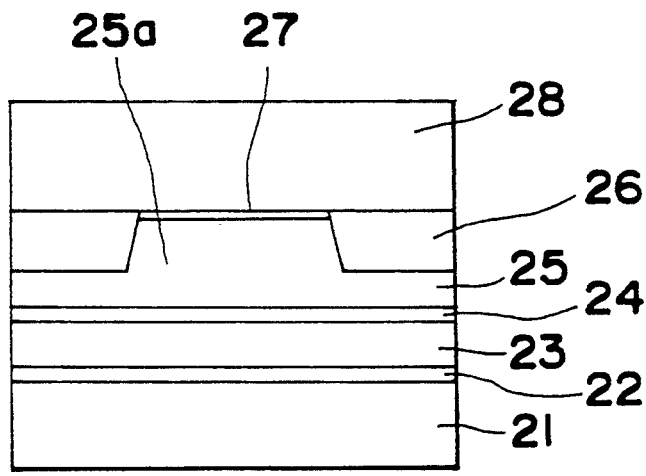
FIG. 1 is a sectional view of a prior art semiconductor laser device.
Figure 2:
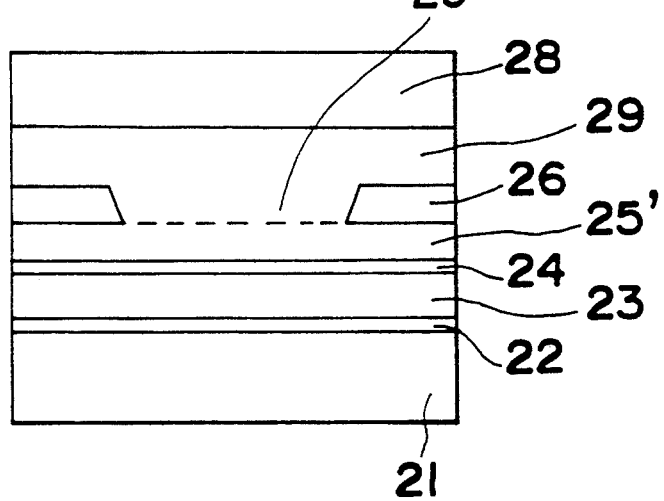
FIG. 2 is a sectional view of another prior art semiconductor laser device.

These advantages can be realized because the current blocking layer 6 is made of a GaAlAs material similar to the active layer 4 and the cladding layer 5. In the semiconductor laser, the refractive index of the n-type $Ga_{0.35}Al_{0.65}As$ current blocking layer 6 can be chosen to be about 3.2 which is only a little smaller than about 3.3 of the refractive index of the p-type $Ga_{0.5}Al_{0.5}As$ cladding layer 5 because the current blocking layer is made of a GaAlAs material similar to those of the active layer 4 and the cladding layer 5. Thus, a very gradual difference can be realized in the effective refractive index between the inside and the outside of the stripe of the same order of that in the above-mentioned loss index guided structures in the prior art semiconductor laser devices as shown in FIGS. 1 and 2. If the current blocking layer were made of a material different from those of the active layer 4 and of the cladding layer 5, for example of ZnSe having about 2.4 of a refractive index, the difference in the effective refractive index between the inside and the outside of the stripe is too large to broaden the light below the current blocking layer 6, so that the spectra is hard to become a multimode.

Figure 4A:
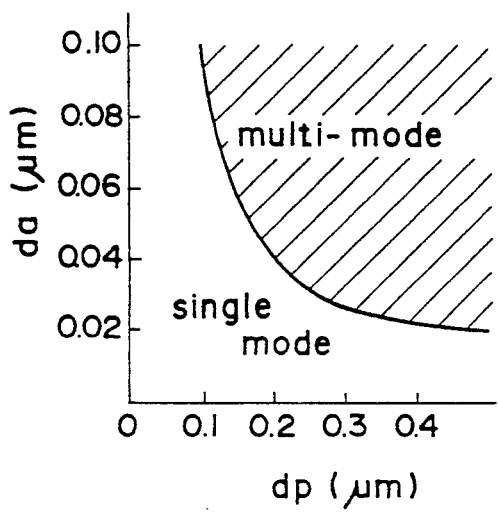
FIG. 4(a) is a graph of the characteristic of the semiconductor laser shown in FIG. 3.
Figure 4B:
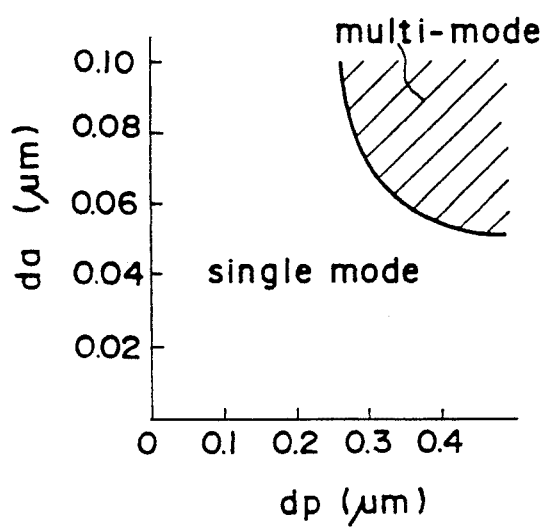
FIG. 4(b) is a graph of the characteristic of a prior art semiconductor laser shown in FIG. 1.

FIGS. 4(a) and 4(b) show data on spectral characteristics and structure parameters of a semiconductor device shown in FIG. 3 and of a prior art semiconductor device shown in FIG. 1, respectively, wherein "da" represents the thickness of the active layer 4 and "dp" represents the thickness of the p-type cladding layer 5 between the active layer 4 and the current blocking layer 6. It is found that the multimode can be realized in this invention even if the thicknesses "da" and/or "dp" are small, compared with the prior art device. Especially, because "dp" may be made thinner, a semiconductor laser device of low noises can be obtained in a state wherein the leak current flowing to the outside of the stripe is small. For example, in the prior art semiconductor laser device, it is difficult to realize multimode if "dp" is 0.3 μm or less. On the contrary, in the semiconductor laser device according to the present invention, multimode oscillation can be realized even if "dp" is 0.2 μm or less.

Figure 5:
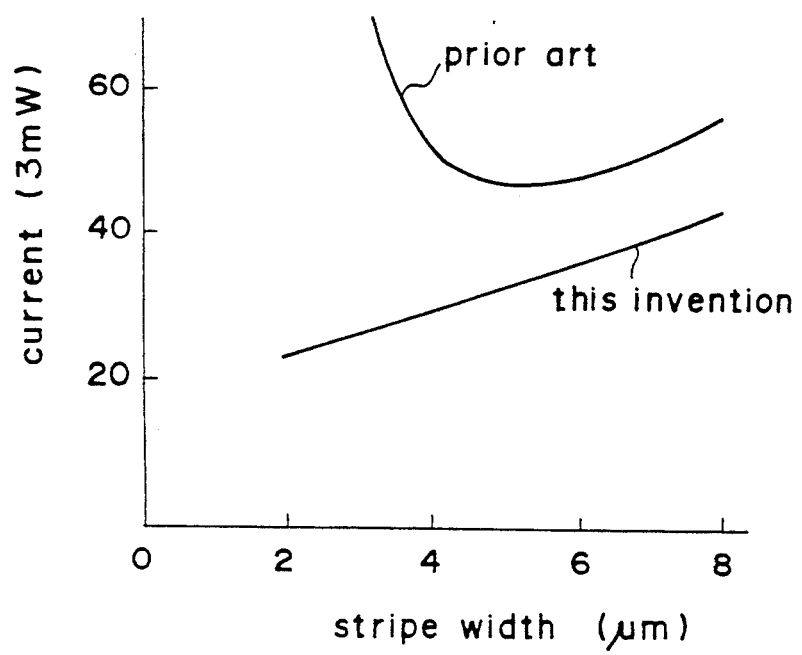
FIG. 5 is a graph of a relation of stripe width (width at the lower end of the ridge) against operating current value.

FIG. 5 shows a relation of stripe width (or width at the lower end of the ridge) against operating current. In a structure of the present invention, even if the stripe width is narrowed, the operating current value does not increase due to no optical absorption in the current blocking layer 6. That is, the stripe width can be set for a rather small current to flow. Thus, this point also allows to lower the operating current. For example, if the stripe width is decreased to 4 μm or less, the operating current is increased in the prior art device, whereas it can be decreased still further in the present invention. If the stripe width is decreased in the present invention, the multimode in spectra can be realized more easily because the light into the current blocking layer increases relatively to the light enclosed in the current blocking layer. That is, if the stripe width is decreased, a semiconductor laser device generates less noises.

Further, it is preferable to use silicon as an n-type dopant in order to improve low noise characteristics. The optical absorption of the n-type layer with silicon as a dopant saturates at a lower optical density when compared with a dopant such as selenium or tellurium (saturable absorption). Therefore, loss grating is not formed as to the oscillating mode and the spectra is likely to become the multimode. In the following Examples, silicon is used as a dopant.

In general, a semiconductor laser device of Example 1 of the structure of FIG. 3 includes a $Ga_{1-X}Al_XAs$ layer as an active layer 4, a $Ga_{1-Y}Al_YAs$ cladding layer 5 of a conduction type, and a $Ga_{1-Z}Al_ZAs$ current blocking layer 6 of the other conduction type than the conduction type of the $Ga_{1-Y}Al_YAs$ cladding layer 5, and the AlAs mole fractions X, Y and Z has a following relation:

$$Z > Y > X \geq 0.$$

The feature of the structure is that the AlAs mole fraction Z of current blocking layer 6 is higher than Y of the cladding layer 5 as stated above ($Z > Y$).

The AlAs mole fraction Y of the cladding layer 5 is higher than that X of the active layer 4 in order to form a double hetero structure giving confinement of carriers and light into the active layer ($Y > X \geq 0$).

FIGS. 6(a)–(d) show steps in a manufacturing method of a semiconductor laser device according to Example 1.

Figure 6A:
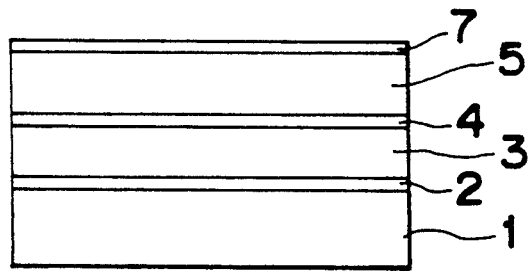
FIGS. 6(a), 6(b), 6(c) and 6(d) are sectional views of steps in a manufacturing method of a semiconductor laser device according to Example 1.

As shown in FIG. 6(a), An n-type GaAs buffer layer 2 (thickness 0.5 μm), an n-type $Ga_{0.5}Al_{0.5}As$ cladding layer 3 (thickness 1 μm), a $Ga_{0.85}Al_{0.15}As$ active layer 4 (thickness 0.07 μm), a p-type GaAs $Ga_{0.5}Al_{0.5}As$ cladding layer 5 (thickness 1 μm) and a p-type GaAs protection layer 7 (thickness 0.2 μm) are formed successively on an n-type GaAs substrate 1 with use of a metal organic chemical vapor deposition (MOCVD) technique or a molecule beam epitaxy (MBE) technique. The protection layer 7 is necessary to protect the top of a ridge 5a of the p-type $Ga_{0.5}Al_{0.5}As$ cladding layer 5, through which a current flows, from surface oxidation. The conduction type of the active layer 4 may be p-type or n-type, or the active layer 4 may not be doped.

Figure 6B:
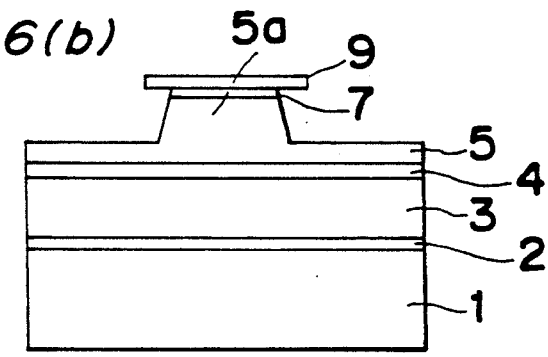
Figure 6C:
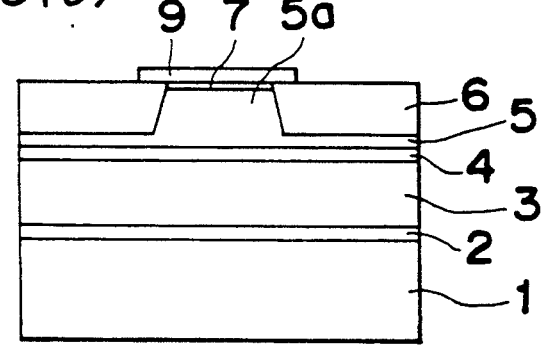

Next, as shown in FIG. 6(b), a stripe-like dielectric film 9 of nitride (silicon nitride, tungsten nitride or the like) or of silicon oxide is formed, and the ridge 5a is formed by etching with use of the dielectric film 9 as a mask.

The width at the lower end of the ridge or a stripe width is set to be 2.5 μm, and the thickness (dp) of the p-type cladding layer 5 except the ridge 5a is set to be 0.15 μm.

Then, an n-type $Ga_{0.35}Al_{0.65}As$ current blocking layer 6 (thickness 1 μm) is grown selectively with use of metal organic chemical vapor deposition technique with the dielectric film 9.

In this structure, the loss due to optical absorption is not generated by the current blocking layer 6. Therefore, as shown in FIGS. 4 and 5, the stripe width and the dp value can be decreased by a half, when compared with prior art devices shown in FIGS. 1 and 2. Thus, the operating current can be decreased from a point of view of the size of the structure.

It is preferable that the ridge 5a has a mesa shape than an undercut mesa shape. If the ridge 5a has an undercut mesa shape, the crystal growth becomes harder, when compared with a mesa shape, and it is liable to lower the yield due to the deterioration of the characteristics. In fact, when a ridge 5a of an undercut mesa shape is formed, the crystallinity of the selectively grown GaAlAs layer 6 is deteriorated at the sides of the ridge and the threshold value of the device becomes higher by about 10 mA, when compared with a device of a ridge of a mesa shape. The characteristics of devices to be explained below relates only to devices having a ridge of a mesa shape.

If the thickness of the current blocking layer 6 becomes too thin, the optical absorption of laser light will happen at a p-type GaAs contact layer 8 to be provided above. Therefore, the thickness of the current blocking layer 6 is necessary to be as thick as 0.4 μm or larger.

Figure 6D:
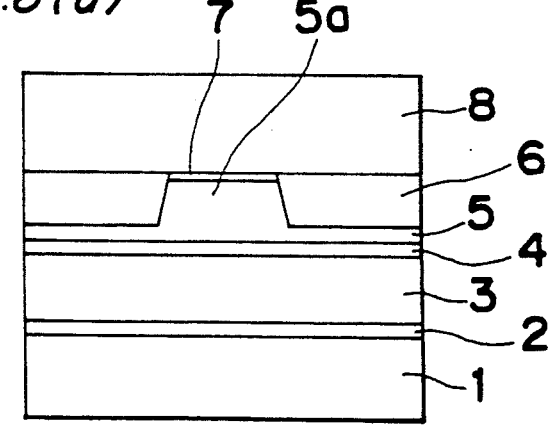

Next, as shown in FIG. 6(d), the dielectric film 9 is removed, and a p-type GaAs contact layer 8 is formed with a metal organic chemical vapor deposition technique of with a molecular beam epitaxy technique.

Finally, electrodes are formed on the n-type GaAs substrate 1 and the p-type GaAs contact layer 8.

Figure 7:
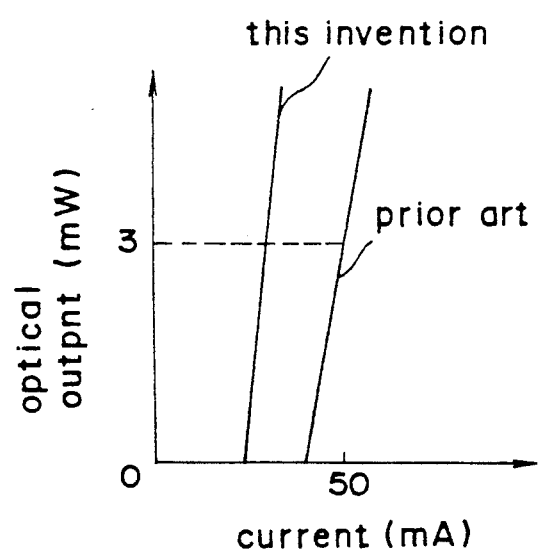
FIG. 7 is a graph of current vs. optical output characteristic.

FIG. 7 shows a current vs. optical output characteristic of a semiconductor laser device of Example 1. For comparison, the data on the prior art device is also displayed. As to the semiconductor laser device of the present invention, because the loss of waveguide is small, the threshold value is lower and the efficiency becomes higher. Therefore, the operating current value becomes low remarkably. In an example of a device of cavity length 200 μm, the operating current value necessary to emit laser light of 3 mW at room temperature can be decreased from 50 mA to 25 mA. The spectrum shows that the device oscillates in a multimode which generates self-pulsation, and an RIN value of −130 dB/Hz is obtained in a ratio of feedback light between 0 and 10%.

Example 2

In the above-mentioned Example 1, when the n-type current blocking layer 6 is grown directly on the p-type cladding layer 5, it may happen that the interface for the regrowth becomes a p-n junction to form deep levels, and the temperature dependence of the current vs. optical output characteristic may be affected badly. Then, a problem arises that the characteristic temperature becomes low. In order to prevent this phenomenon, it is effective to form an n-type current blocking layer after a p-type thin layer is formed in the second crystal growth. In this case, the interface for the regrowth does not become a p-n junction, and deep levels are not generated.

Figure 8:
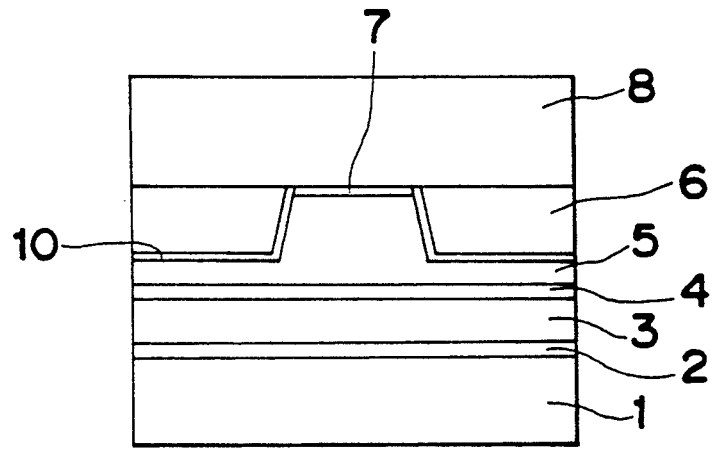
FIG. 8 is a sectional view of a semiconductor device of Example 2 wherein a p-type layer 10 is formed in the second crystal growth.

FIG. 8 shows an Example wherein a p-type $Ga_{0.35}Al_{0.65}As$ layer 10 is formed in the second crystal growth process on the p-type cladding layer 5 and an n-type $Ga_{0.35}Al_{0.65}As$ current blocking layer 6 is applied to the p-type layer 10. It is necessary that the AAs mole fraction of the p-type layer 10 is larger than that of the active layer 4 in order to make the p-type layer 10 transparent for the laser light and that its thickness is 0.1 μm or less in order to reduce leak current in the lateral directions. In the device shown in FIG. 8, the AlAs mole fraction of the p-type layer 10 is selected to be the same as that of the current blocking layer 6 in order to make the refractive index the same as the corresponding layer 6 in Example 1 wherein the p-type layer 10 is not formed. The thickness of the p-type layer 10 is set to be 0.01 μm so that it nearly affects the current distribution. In the semiconductor laser device having a structure shown in FIG. 8, the operating current is low, the noises are low and the temperature characteristics is superior.

In general, a semiconductor laser device of Example 2 of the structure of FIG. 8 includes a $Ga_{1-X}Al_XAs$ layer as an active layer 4, a $Ga_{1-Y}Al_YAs$ layer 5 of a conduction type, provided on at least one of the principal planes of the $Ga_{1-X}Al_XAs$ layer 4, a $Ga_{1-Z}Al_ZAs$ layer 6 of the other conduction type than the conduction type of the $Ga_{1-Y}Al_YAs$ layer 5, and a $Ga_{1-B}Al_BAs$ layer 10 of 0.1 μm or less of thickness of the same conduction type as the conduction type of the $Ga_{1-Y}Al_YAs$ layer 5. The $Ga_{1-Z}Al_ZAs$ layer 6 is provided on the two sides in the longitudinal direction of the stripe-like region of the $Ga_{1-Y}Al_YAs$ layer 5. The $Ga_{1-B}Al_BAs$ layer 10 is provided between the $Ga_{1-Y}Al_YAs$ layer 5 and the $Ga_{1-Z}Al_ZAs$ layer 6. The AlAs mole fractions X, Y, Z and B has following relations: $Z>Y>X \geq 0$, and $B>X$.

Example 3

Further, in the above-mentioned manufacturing method, if the dielectric layer 9 is made of for example silicon nitride, when an HF etchant is used to remove the dielectric layer 9, the n-type current blocking layer 6 formed in the second crystal growth process may be etched simultaneously. In order to prevent this phenomenon, it is effective to form a GaAlAs layer 11 having an AlAs mole fraction lower than the current blocking layer 6 and low enough to prevent etching. The GaAlAs layer 11 has also an advantage that it can protect the current blocking layer 6 having a higher mixed crystal ratio from surface oxidation.

Figure 9:
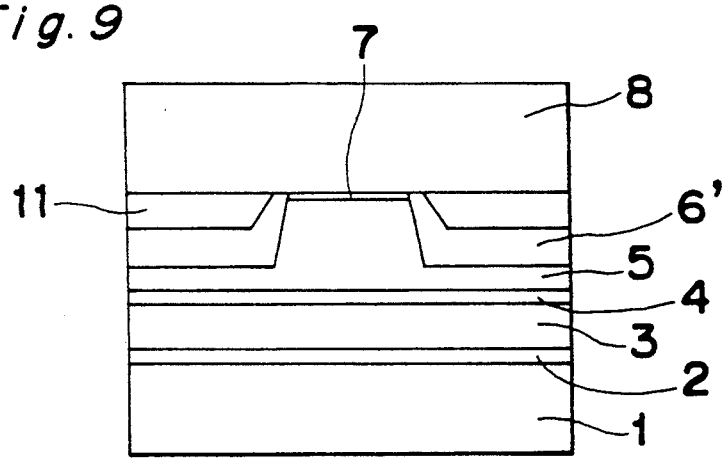
FIG. 9 is a sectional view of a semiconductor laser device according to Example 3 wherein a layer 11 is formed in the second crystal growth.

FIG. 9 shows a structure of a semiconductor laser device wherein an n-type GaAs layer 11 of 0.5 μm thickness is formed on an n-type $Ga_{0.35}Al_{0.65}As$ current blocking layer 6'. The thickness 0.5 μm of the current blocking layer 6, is made thinner than that of the current blocking layer 6 of Example 1 in order to keep the flatness. The conduction type of the new layer 11 is preferably n-type for current block. However, if the current blocking layer 6' has a thickness of 0.4 μm or more, the layer 11 may be a p-type layer or a high resistive layer because the current is blocked by the current blocking layer 6'. Further, the layer 11 may consist of a plurality of layers. In the semiconductor laser device having a structure shown in FIG. 9, the operating current is low, the noises are low and the fabrication process is superior.

A semiconductor laser device of a structure of Example 3 includes a $Ga_{1-X}Al_XAs$ layer as an active layer 4, a $Ga_{1-Y}Al_YAs$ layer 5 of a conduction type, a $Ga_{1-Z}Al_ZAs$ layer 6 of the other conduction type than the conduction type of the $Ga_{1-Y}Al_YAs$ layer, and one or more $Ga_{1-E}Al_EAs$ layers 11 provided on the $Ga_{1-Z}Al_ZAs$ layer. The $Ga_{1-Y}Al_YAs$ layer 5 is provided on at least one of the principal planes of the $Ga_{1-X}Al_XAs$ layer 4, and has a stripe-like current channel portion. The $Ga_{1-Z}Al_ZAs$ layer being provided along the two sides in the longitudinal direction of the stripe-like current channel portion. The AlAs mole fractions X, Y, Z and E has following relations:

$Z>Y>X \geq 0$, and $Z>E \geq 0$.

In the semiconductor laser devices of the above-mentioned Examples 1 3, the operating current is low. Therefore, they are effective to increase the optical output power of semiconductor laser. Especially, even if the thickness of the active layer 4 is made as thin as 0.03–0.05 μm, the spectra can be made multimode as shown in FIG. 4. Thus, a semiconductor laser of low noises and of high output power can be realized.

When such a semiconductor laser device is manufactured with a cavity length of 350 μm for high output power and mirror coating is performed on the facets, an optical output of 100 mW or more is realized. If such a high output power device is used for an optical source of optical disk, a high frequency superimposing circuit used to decrease noises on reading can be omitted, and the size of a pickup can be reduced largely. Further, if "dp" is made thin to decrease leak current, the optical output can be increased more though the spectra becomes a single longitudinal mode.

Example 4

Figure 10:
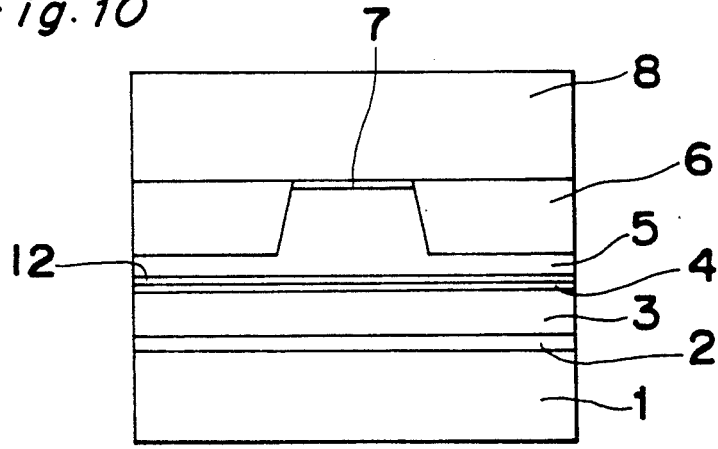
FIG. 10 is a sectional view of a semiconductor laser device according to Example 4 wherein a guide layer 12 is formed in the first crystal growth.

The optical density at the facets of the active layer 4 can be decreased by applying a guide layer 12 to the active layer 4 in the structure of Example 1 in order to obtain higher output power, as shown in FIG. 10. The AlAs mole fraction of the guide layer 12 is chosen to be lower than that of the cladding layer 5 in order to get a high refractive index. On the other hand, it is preferable from the viewpoint of the temperature characteristic that the energy gap is larger by 0.3 eV or more than that of the active layer 4. Then, the AlAs mole fraction of the guide layer 12 is set to be 0.4 in this embodiment. The thickness of the layer 12 is as thin as 0.1 μm in order to reduce the leak current in the lateral directions. The guide layer 12 may be provided between the active layer 4 and the p-type cladding layer 5 as shown in FIG. 10, while it may also be provided between the active layer 4 and the n-type cladding layer 3 or in both sides of the active layer 4. Thus, by using the structure shown in FIG. 10, a semiconductor laser of low noises, low operating current and of high output power can be realized.

A semiconductor laser device of a structure of Example 4 includes a $Ga_{1-X}Al_XAs$ layer as an active layer 4, a $Ga_{1-Y}Al_YAs$ layer 5 of a conduction type, a $Ga_{1-Z}Al_ZAs$ layer 6 of the other conduction type than the conduction type of the $Ga_{1-Y}Al_YAs$ layer, and a $Ga_{1-D}Al_DAs$ layer applied to the $Ga_{1-X}Al_XAs$ layer The $Ga_{1-Y}Al_YAs$ layer 5 is provided on at least one of the principal planes of the $Ga_{1-X}Al_XAs$ layer 4, and has a stripe-like current channel portion. The $Ga_{1-Z}Al_ZAs$ layer being provided along the two sides in the longitudinal direction of the stripe-like current channel portion. The $Ga_{1-D}Al_DAs$ layer is provided adjacent to the $Ga_{1-X}Al_XAs$ layer. The AlAs mole fractions X, Y, Z and D have a following relation:

$$Z > Y > D > X \geq 0.$$

The effects obtained by providing the layer 10 as shown in FIG. 8, the layer 11 as shown in FIG. 9 and the layer 12 as shown in FIG. 10 are independent of each other. Therefore, by combining the layers 10–12, a superior semiconductor laser device can be realized, as explained below.

Example 5

Figure 11:
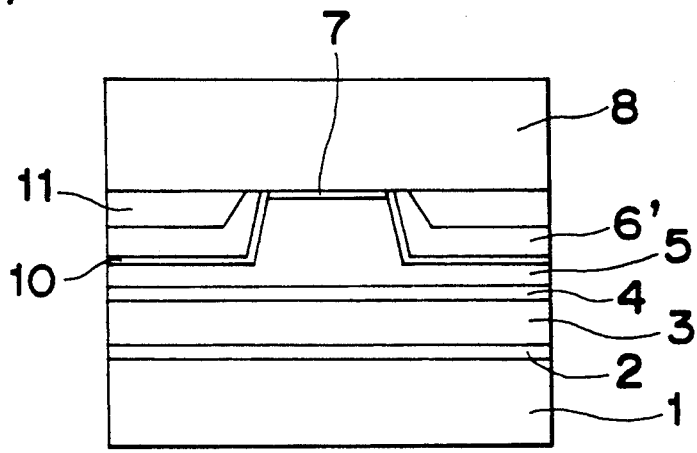
FIG. 11 is a sectional view of a semiconductor laser device according to Example 5.

FIG. 11 shows a structure of a semiconductor laser device for combining the layers 10 and 11 of FIGS. 8 and 9. A p-type $Ga_{0.35}Al_{0.65}As$ layer 10 as shown in FIG. 8, an n-type $Ga_{0.35}Al_{0.65}As$ current blocking layer 6' as shown in FIG. 9 and a GaAlAs layer 11 applied to an n-type $Ga_{0.35}Al_{0.65}As$ current blocking layer 6' as shown in FIG. 9 are formed successively a p-type cladding layer 5. Then, a superior semiconductor laser device having a low operating current, low noises and high characteristic temperature is provided and it is easy to be manufactured.

Example 6

Figure 12:
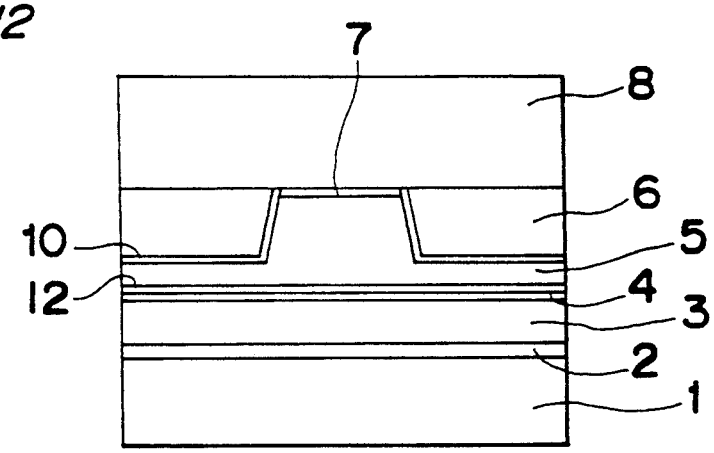
FIG. 12 is a sectional view of a semiconductor laser device according to Example 6.

FIG. 12 shows a structure of a semiconductor laser device for combining the layers 10 and 12 of FIGS. 8 and 10. A guide layer 12 is applied to the active layer 4 as shown in FIG. 10 and a p-type $Ga_{0.35}Al_{0.65}As$ layer 10 is applied to the p-type Cladding layer 5 as shown in FIG. 8. The guide layer 12 may be provided above or below the active layer 4 or at both sides thereof. Then, a superior semiconductor laser device having a low operating current, low noises and high characteristic temperature and a high output power can be realized.

Example 7

Figure 13:
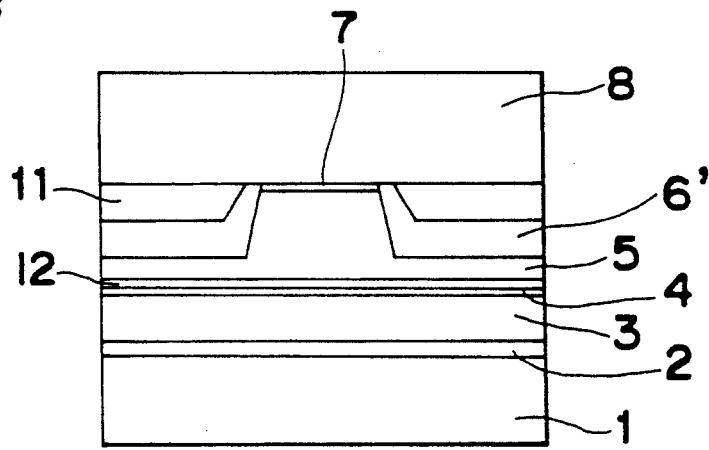
FIG. 13 is a sectional view of a semiconductor laser device according to Example 7.

FIG. 13 shows a structure of a semiconductor laser device for combining the structures of FIGS. 9 and 10. A guide layer 12 is applied to the active layer 4 as shown in FIG. 10 and an n-type $Ga_{0.35}Al_{0.65}As$ current blocking layer 6, and an GaAlAs layer 11 as shown in FIG. 9 are formed successively on a p-type cladding layer 5. The guide layer 12 may be provided above or below the active layer 4 or at both sides thereof. Then, a superior semiconductor laser device having a low operating current, low noises and high output power and easy to be manufactured can be realized.

Example 8

Figure 14:
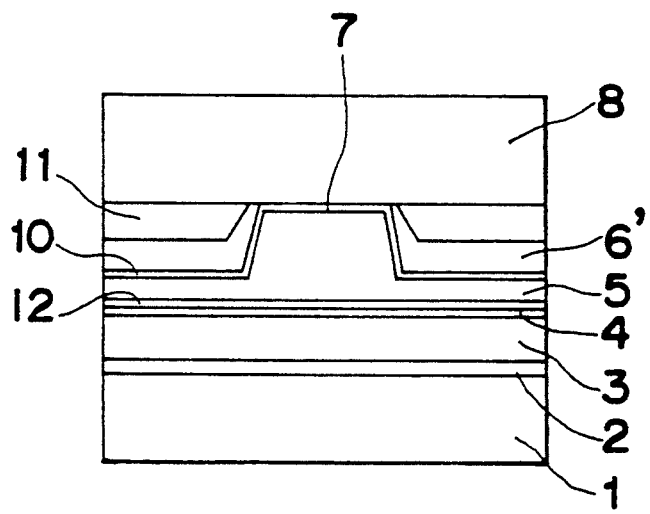
FIG. 14 is a sectional view of a semiconductor laser device according to Example 8.

FIG. 14 shows a structure of a semiconductor laser device for combining the layers 10–12 of FIGS. 8, 9 and 10. A guide layer 12 is applied to the active layer 4 as shown in FIG. 10, and a p-type $Ga_{0.35}Al_{0.65}As$ layer 10 shown in FIG. 8, an n-type $Ga_{0.35}Al_{0.65}As$ current blocking layer 6' and a GaAlAs layer 11 as shown in FIG. 9 are formed successively on a p-type cladding layer 5. The guide layer 12 may be provided above or below the active layer 4 or at both sides thereof. Then, a superior semiconductor laser device having a low operating current, low noises, a high characteristic temperature and a high output power is provided and it is easy to be manufactured.

Examples 9–16

In order to manufacture semiconductor laser devices of the above-mentioned embodiments, it is preferable to introduce an etching stop layer in the first crystal growth process in order to control "dp" or the thickness of the cladding layer 5 between the active layer 4 and the current blocking layer 6. The etching stop layer is made of GaAlAs having the AlAs mole fraction lower than that of the cladding layer 5. A stripe-like ridge portion with an AlAs mole fraction lower than that of the current blocking layer 6 is formed on the etching stop layer.

Figure 15:
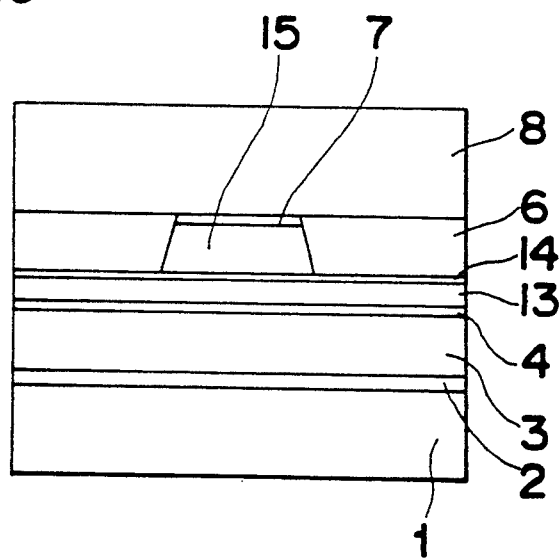
FIG. 15 is a sectional view of a semiconductor laser device according to Example 9.

FIG. 15 displays a structure of a semiconductor laser device of Example 9, wherein an etching stop layer 14 is provided in the above-mentioned semiconductor laser device shown in FIG. 3 and a stripe-like ridge portion 15 with an AlAs mole fraction lower than that of the current blocking layer 6 is formed on the etching stop layer 14. A layer 13 is a cladding layer made of the same material as the cladding layer 5 as shown in FIG. 3.

Figure 16:
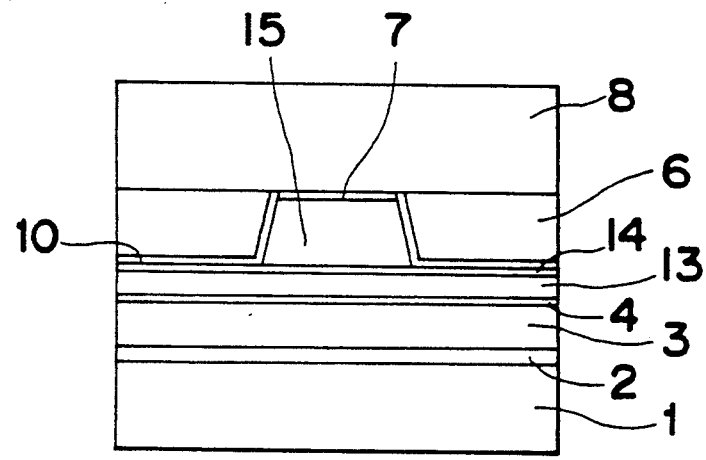
FIG. 16 is a sectional view of a semiconductor laser device according to Example 10.

FIG. 16 displays a structure of a semiconductor laser device of Example 10, wherein an etching stop layer 14 with an AlAs mole fraction lower than that of a stripe-like ridge portion 15 is provided in the above-mentioned semiconductor laser device shown in FIG. 8 and the stripe-like ridge portion 15 with an AlAs mole fraction lower than that of the current blocking layer 6 is formed on the etching stop layer 14.

Figure 17:
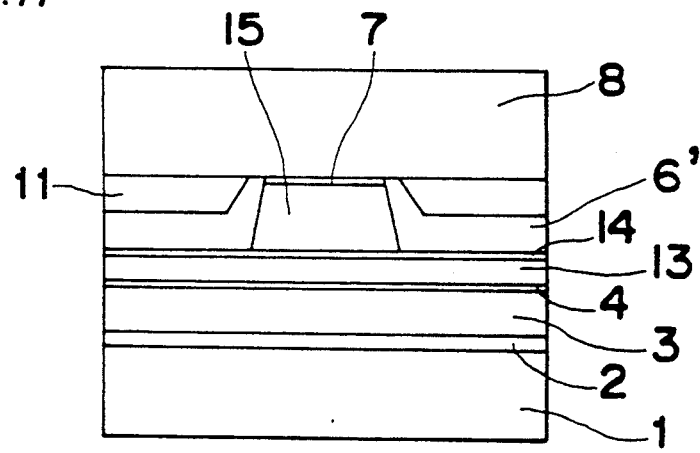
FIG. 17 is a sectional view of a semiconductor laser device according to Example 11.

FIG. 17 displays a structure of a semiconductor laser device of Example 11, wherein an etching stop layer 14 with an AlAs mole fraction- lower than that of a stripe-like ridge portion 15 is provided in the above-mentioned semiconductor laser device shown in FIG. 9 and the stripe-like ridge portion 15 with an AlAs mole fraction lower than that of the current blocking layer 6 is formed on the etching stop layer 14.

Figure 18:
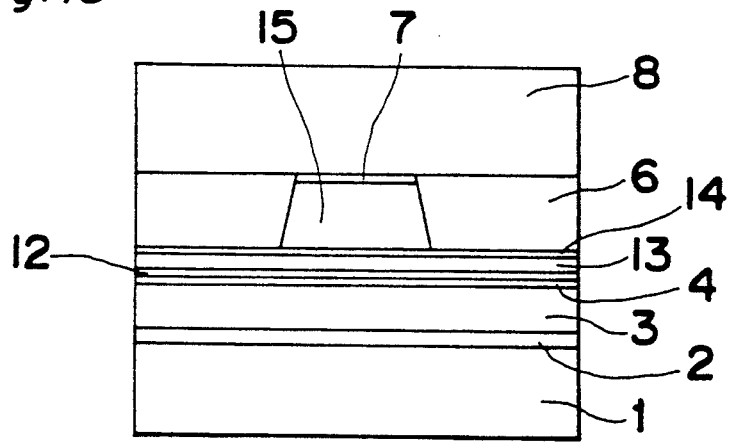
FIG. 18 is a sectional view of a semiconductor laser device according to Example 12.

FIG. 18 displays a structure of a semiconductor laser device of Example 12, wherein an etching stop layer 14 with an AlAs mole fraction lower than that of a stripe-like ridge portion 15 is provided in the above-mentioned semiconductor laser device shown in FIG. 10 and the stripe-like ridge portion 15 with an AlAs mole fraction lower than that of the current blocking layer 6 is formed on the etching stop layer 14.

Figure 19:
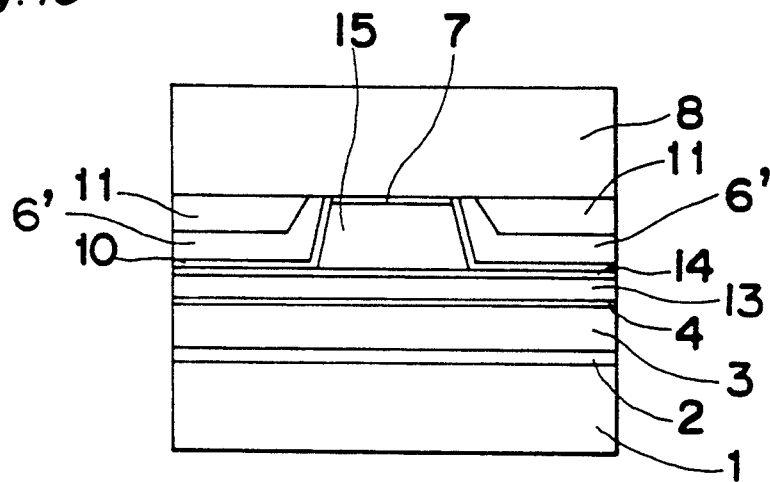
FIG. 19 is a sectional view of a semiconductor laser device according to Example 13.

FIG. 19 displays a structure of a semiconductor laser device of Example 13, wherein an etching stop layer 14 with an AlAs mole fraction lower than that of a stripe-like ridge portion 15 is provided in the above-mentioned semiconductor laser device shown in FIG. 11 and the stripe-like ridge portion 15 with an AlAs mole fraction lower than that of the current blocking layer 6 is formed on the etching stop layer 14.

Figure 20:
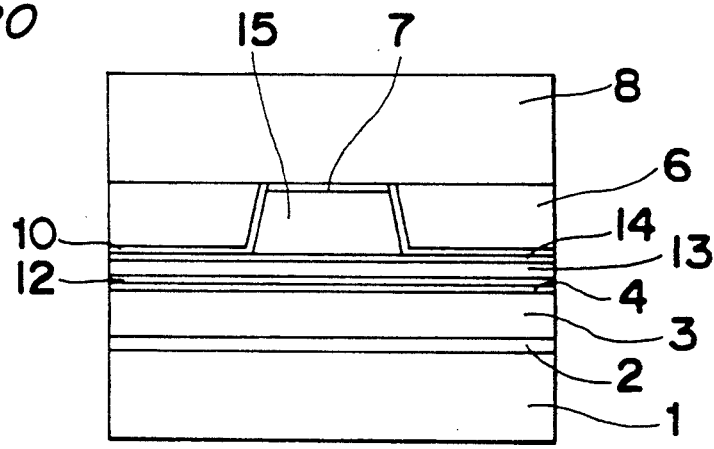
FIG. 20 is a sectional view of a semiconductor laser device according to Example 14.

FIG. 20 displays a structure of a semiconductor laser device of Example 14, wherein an etching stop layer 14 with an AlAs mole fraction lower than that of a stripe-like ridge portion 15 is provided in the above-mentioned semiconductor laser device shown in FIG. 12 and a stripe-like ridge portion 15 with an AlAs mole fraction lower than that of the current blocking layer 6 is formed on the etching stop layer 14.

Figure 21:
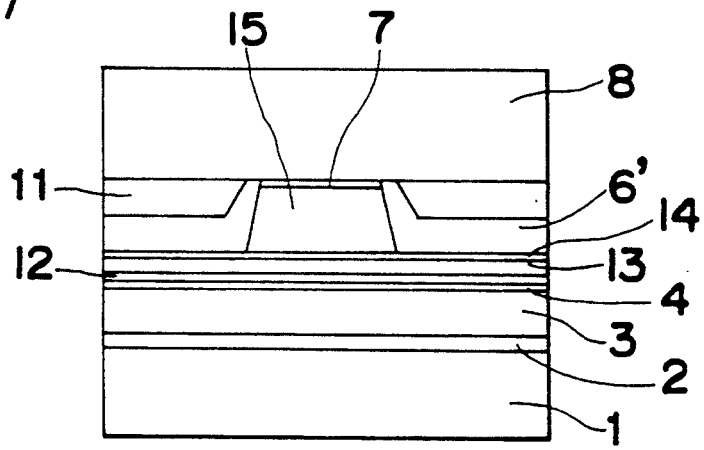
FIG. 21 is a sectional view of a semiconductor laser device according to Example 15.

FIG. 21 displays a structure of a semiconductor laser device of Example 15, wherein an etching stop layer 14 with an AlAs mole fraction lower than that of a stripe-like ridge portion 15 is provided in the above-mentioned semiconductor laser device shown in FIG. 13 and the stripe-like ridge portion 15 with an AlAs mode fraction lower than that of the current blocking layer 6 is formed on the etching stop layer 14.

Figure 22:
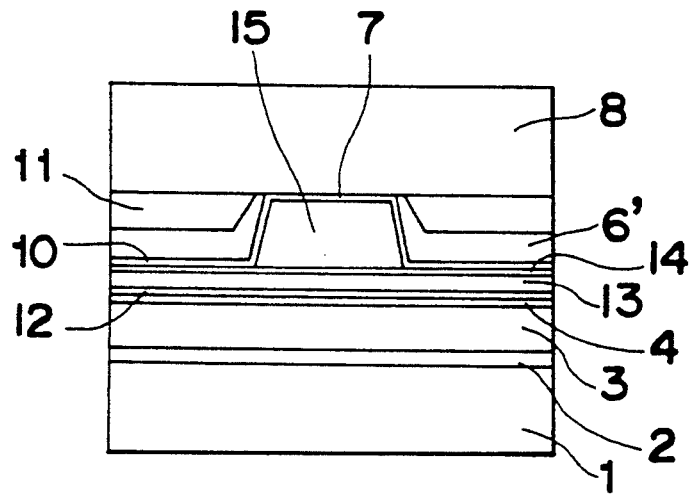
FIG. 22 is a sectional view of a semiconductor laser device according to Example 16.

FIG. 22 displays a structure of a semiconductor laser device of Example 16, wherein an etching stop layer 14 with an AlAs mole fraction lower than that of a stripe-like ridge portion 15 is provided in the above-mentioned semiconductor laser device shown in FIG. 14 and a stripe-like ridge portion 15 with an AlAs mole fraction lower than that of current blocking layer 6 is formed on the etching stop layer 14.

The ridge portion 15 can be formed as follow: A p-type $Ga_{0.8}Al_{0.2}As$ etching stop layer 14 is formed on a p-type cladding layer 13, and a p-type $Ga_{0.5}Al_{0.5}As$ second cladding layer 15 is formed on the p-type $Ga_{0.8}Al_{0.2}As$ etching stop layer 14. First, etching is stopped in the p-type $Ga_{0.5}Al_{0.5}As$ second cladding layer 15 with use of an enchant such as sulfuric acid or tartaric acid which nearly has selecting property as to the AlAs mole fraction. Next, etching is stopped at the surface of the etching stop layer 14 with use of an enchant such as chloric acid at 60° C. which has selecting property as to a layer having a higher AlAs mole fraction. By introducing the etching stop layer 14, the thickness "dp" is determined by the thickness of the first cladding layer 13, and it can be kept constant in the wafer plane or between lots. Thus, the yield can be increased largely.

The semiconductor laser devices displayed in FIGS. 15-22 can be manufactured at a high yield while realizing the characteristics due to the structures of FIGS. 3, 8-14. The thickness of the etching stop layer 14 is preferably 0.05 μm or less so as not to affect the optical distribution. In these embodiments, the thickness is set to be 0.03 μm. Further, the AlAs mole fraction of the etching stop layer 14 is preferably a value higher than that of the active layer so as not to absorb the laser light. In these embodiments, the AlAs mole fraction is set to be 0.2.

In general, semiconductor laser devices of structures of FIGS. 15-22 includes a $Ga_{1-Y1}Al_{Y1}As$ layer 13 of a conduction type, provided on at least one of the principal planes of a $Ga_{1-X}Al_{X}As$ active layer 4, a $Ga_{1-C}Al_{C}As$ layer 14 of the conduction type applied to the $Ga_{1-Y1}Al_{Y1}As$ layer 13, a $Ga_{1-Y2}Al_{Y2}As$ second cladding layer 15 of the conduction type, applied successively to the $Ga_{1-X}Al_{X}As$ active layer 4 and a $Ga_{1-Z}Al_{Z}As$ current blocking layer 6 being provided along the two sides of the stripe-like current channel portion. The AlAs mole fractions X, Y1, Y2, C and D has following relations:

$$Z > Y2 > C > X \geq 0, \text{ and } Z > Y1 \geq X.$$

Example 17

A quantum well structure can be adopted as an active layer instead of the $Ga_{1-X}Al_{X}As$ active layer 4 in the abovementioned Examples 1-16. Then, the operating current can be lowered further, and the optical output can be increased further.

Figure 23:
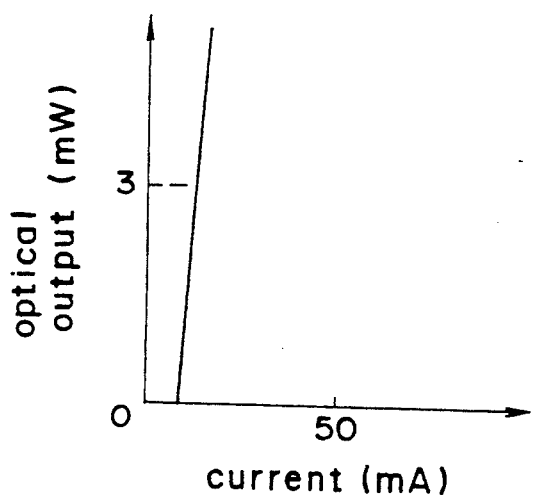
FIG. 23 is a graph of optical output characteristic of a semiconductor laser device according to Example 17.

FIG. 23 shows optical output characteristics of a semiconductor laser device wherein a quantum well structure is used for an active layer 4 in the structure of Example 1 shown in FIG. 3. The quantum well structure is a multi-quantum well structure including four $Ga_{0.95}Al_{0.05}As$ well layers of thickness 10 nm, and five $Ga_{0.7}Al_{0.3}As$ barrier layers of thickness 4 nm interposing the four well layers which perform oscillation at 780 nm band. Of course, other types of quantum well such as double quantum well structure, triple quantum well structure, GRIN structure or separate confinement heterostructure may be adopted in the active layer of the quantum well structure. A device of cavity length 200 μm is manufactured, and the characteristics of the device is measured as shown in FIG. 23. That is, the operating current value is as low as 12 mA for emitting 3 mW of laser light. The laser device oscillates in a multimode, and low noise characteristics can be obtained.

Further, the introduction of quantum well structure decreases the carrier density dependence of refractive index of the active layer, so that the kink level of a device becomes high. An output power of 200 mW or more can be obtained by making the cavity length of 350 μm for high output power and by coating the facets. Similarly, by applying the quantum well structure to the active layer in Examples 2-16, a lower operating current and a higher output power can be obtained than those of Examples 2-16.

Example 18

The present invention is explained above for a structure having a ridge above an active layer 4. However, this invention is also realized in other waveguide structures. The present invention is explained below with reference to a waveguide structure of groove type such as shown in FIG. 2.

Figure 24:
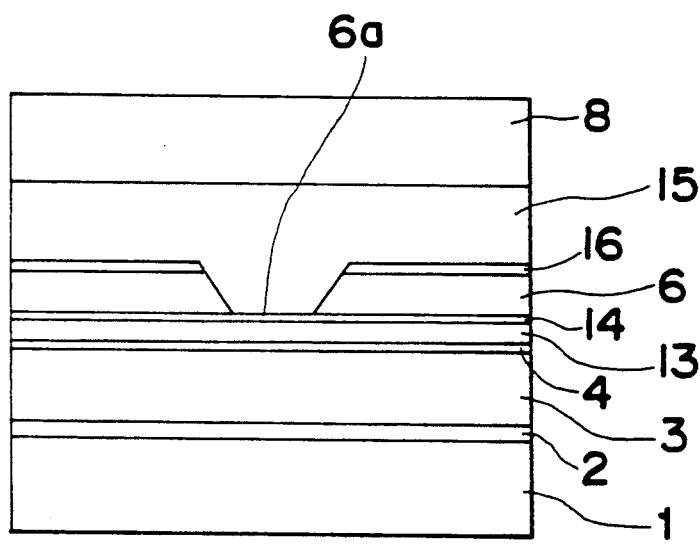
FIG. 24 is a sectional view of a semiconductor laser device according to Example 18.

FIG. 24 displays a semiconductor laser device of Example 18. An n-type GaAs buffer layer 2 is formed on an n-type GaAs substrate 1. Further, an n-type $Ga_{0.5}Al_{0.5}As$ Cladding layer 3, a $Ga_{0.85}Al_{0.15}As$ active layer 4, a p-type $Ga_{0.5}Al_{0.5}As$ first cladding layer 13 and a p-type $Ga_{0.8}Al_{0.2}As$ etching stop layer 14 are formed successively on the buffer layer 2. Then, an n-type $Ga_{0.35}Al_{0.65}As$ current blocking layer 6 is formed on the etching stop layer 14, and a $Ga_{0.8}Al_{0.2}As$ protection layer 16 is formed on the top plane of the current blocking layer 6. Then, a stripe window 6a for a current channel for narrowing a current is formed in the n-type $Ga_{0.35}Al_{0.65}As$ current blocking layer 6 and the $Ga_{0.8}Al_{0.2}As$ protection layer 16 to the p-type $Ga_{0.8}Al_{0.2}As$ etching stop layer 14. Next, a p-type $Ga_{0.5}Al_{0.5}As$ second cladding layer 15 is applied to the $Ga_{0.8}Al_{0.2}As$ protection layer 16 and to the stripe window 6a. Finally, a p-type GaAs contact layer 8 is formed on the second cladding layer 15

In this structure, a current injected from the p-type contact layer 8 is confined in the window 6a, and laser oscillation of 780 nm band is generated in the active layer 4 below the window 6a. Because the AlAs mole fraction of the p-type $Ga_{0.5}Al_{0.5}As$ first cladding layer 13 is larger sufficiently than that of the $Ga_{0.85}Al_{0.15}As$ active layer 4, carriers can be confined effectively in the active layer 4, and this makes it possible to cause oscillation in a visible range. To be concrete, 0.45 or more of AlAs mole fraction is needed in order to realize the oscillation in 780 nm band, and the fraction is set to be 0.5 in this Example. It is preferable that the AlAs mole fraction of the etching stop layer 14 is 0.3 or less in order to make the regrowth easier, and that the etching stop layer 14 is transparent at laser oscillation wavelength. Then, the AlAs mole fraction of the etching stop layer 14 is set to be 0.2 in this Example. Further, it is preferable that the thickness of the etch stop layer 14 is 0.05 μm or less in order not to affect the optical distribution. In this Example, 0.03 μm is adopted.

The width of the energy band gap of the n-type $Ga_{0.35}Al_{0.65}As$ current blocking layer 6 is larger than that of the $Ga_{0.85}Al_{0.15}As$ active layer 4. Therefore, light is not absorbed in the current blocking layer 6, and the device has a low operating current.

In this structure, because light is not absorbed in the current blocking layer 6, laser light expands to below the current blocking layer 6, and the spectrum is likely to be multimode so that low noises can be generated.

In general, a semiconductor laser device of the structure of FIG. 24 includes a $Ga_{1-X}Al_XAs$ layer 4 as an active layer, a $Ga_{1-Y1}Al_{Y1}As$ layer 13 of a conduction type, provided on at least one of the principal planes of the $Ga_{1-X}Al_XAs$ layer 4, a $Ga_{1-C}Al_CAs$ layer 14 of the conduction type, applied to the $Ga_{1-Y1}Al_{Y1}As$ layer 13, a $Ga_{1-Z}Al_ZAs$ layer 6 of the other conduction type than the conduction type of the $Ga_{1-Y1}Al_{Y1}As$ layer 13, which $Ga_{1-Z}Al_ZAs$ layer 6 being applied to the $Ga_{1-C}Al_CAs$ layer 14. The $Ga_{1-Z}Al_ZAs$ layer 6 has a stripe-like window, and a $Ga_{1-Y2}Al_{Y2}As$ layer 15 of the same conduction type as that of the $Ga_{1-Y1}Al_{Y1}As$ layer 13 is applied to the window. In this structure, the AlAs mole fractions X, Y1, Y2, C and Z has following relations:

$$Z > Y2 > C > X \geq 0$$

and $$Z > Y1 > X.$$

Figure 25A:
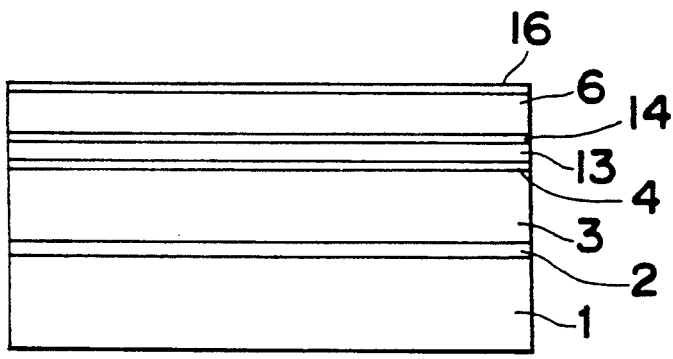
FIGS. 25(a), 25(b) and 25(c) are sectional views of a semiconductor laser device according to Example 18.
Figure 25B:
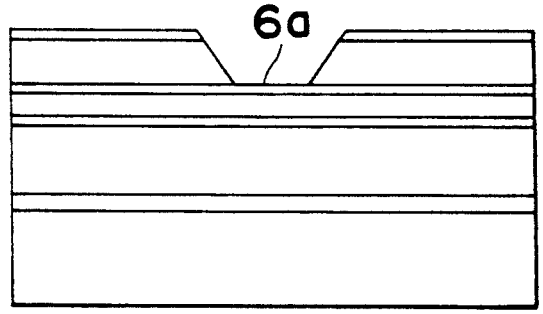
Figure 25C:
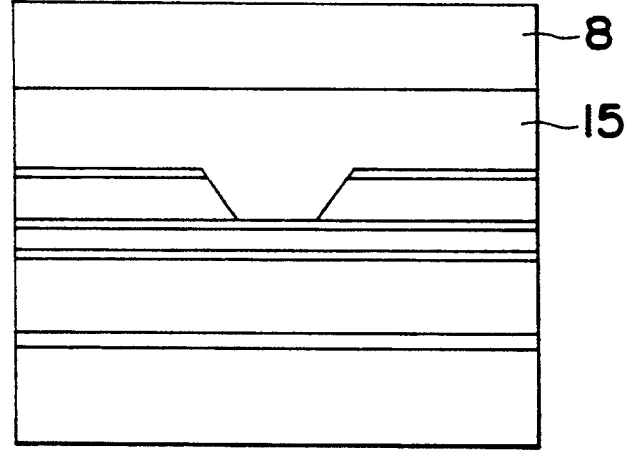

FIGS. 25(a)-(c) show steps for manufacturing a semiconductor laser device of Example 18. Following layers are applied to an n-type GaAs substrate 1 with metal organic chemical vapor deposition technique or molecular beam epitaxial growth technique: an n-type GaAs buffer layer 2 of thickness 0.6 $\mu$m, an n-type $Ga_{0.5}Al_{0.5}As$ cladding layer 3 of thickness 1 $\mu$m, a $Ga_{0.85}Al_{0.15}As$ active layer 4 of thickness 0.04 $\mu$m, a p-type $Ga_{0.5}Al_{0.5}As$ first cladding layer 13 of thickness 0.22 $\mu$m, a p-type $Ga_{0.8}Al_{0.2}As$ etching stop layer 14 of thickness 0.03 $\mu$m, an n-type $Ga_{0.35}Al_{0.65}As$ current blocking layer 6 of thickness 0.5 $\mu$m and a $Ga_{0.8}Al_{0.2}As$ protection layer 16 of thickness 0.01 $\mu$m. The protection layer 16 is necessary for protecting the top of the current blocking layer 6 from surface oxidation. The AlAs mole fraction of the protection layer 16 is 0.3 or less as in the etching stop layer 14, so as to make the regrowth easy and to make the layer transparent against the laser light. In the structure shown in FIG. 24, the conduction types of the active layer 4 and of the protection layer 16 are not stated. However, the conduction types may be p-type or n-type, or the layers may not be doped.

Next, as displayed in FIG. 25(b), a stripe-like window 6a is formed with etching with use of photolithography. In the etching process, an enchant such as tartaric acid or sulfuric acid having no selectivity as to the AlAs mole fraction is used halfway into the current blocking layer 6. Next, the current blocking layer 6 is etched selectively with use of an enchant such as fluoric acid or phosphoric acid which can etch a layer having a higher AlAs mole fraction selectively. The width of the window 6a is set to be 2.5 $\mu$m. Because the p-type $Ga_{0.8}Al_{0.2}As$ layer 14 act as an etching stop layer, scattering due to etching is small and a device can be manufactured at a high yield.

In this type of semiconductor laser device, the shape of stripe is also preferable to be an mesa type than an undercut mesa type because it becomes harder to carry out the regrowth in the undercut mesa type than in the mesa type, and it is liable to lower the yield due to the degradation of the characteristics.

The thickness of the current blocking layer 6 needs to be 0.4 $\mu$m or more. If the thickness is too small, laser light is absorbed above in the p-type GaAs contact layer 8.

Next, as shown in FIG. 25(c), a p-type $Ga_{0.5}Al_{0.5}As$ second cladding layer 15 and a p-type contact layer 8 are formed with regrowth process. Crystal growth can be carried out easily because the layers are grown on the p-type $Ga_{0.8}Al_{0.2}As$ etching stop layer 14 having a low AlAs mole fraction in the stripe for current channel. It is noted that if zinc is used as a dopant in the p-type second cladding layer 15, the carrier concentration is needed to be $10^{18}$ cm$^{-3}$ or less at the interface for regrowth in order to prevent the effect on the characteristics by the diffusion of zinc during crystal growth in the stripe region. In this Example, the concentration is set to be $7 \times 10^{17}$ cm$^{-3}$. Of course, a dopant such as carbon which does not diffuse may be used. Finally, electrodes are formed on the n-type GaAs substrate 1 and on the p-type GaAs contact layer 8.

The characteristics obtained in a semiconductor laser device of Example 18 include a low operating current and low noises, similarly in the semiconductor laser devices of the above-mentioned Examples having a ridge. The characteristics of structural parameters similar to FIGS. 4(a) and 5 also show similar relations. Light-current characteristics is same as FIG. 7 and low noise characteristics (RIN $< -130$ dB/Hz) is also obtained.

Example 19

Figure 26:
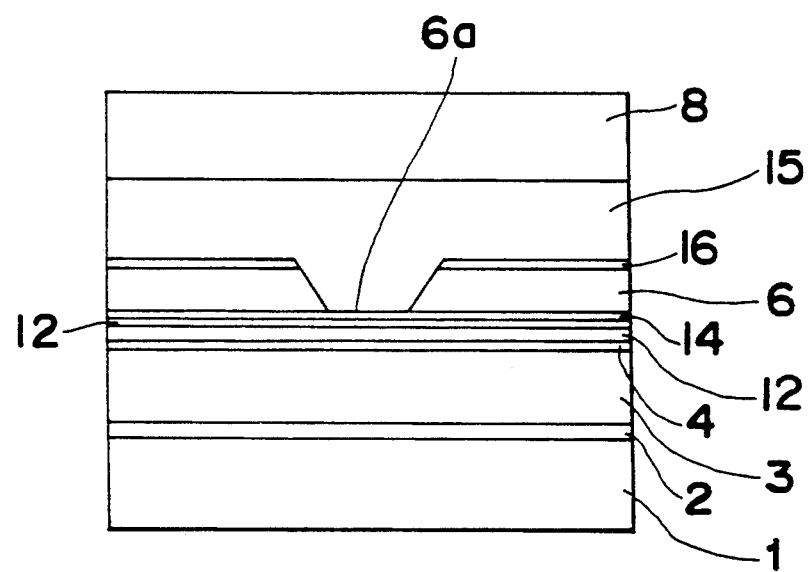
FIG. 26 is a sectional view of a semiconductor laser device according to Example 19.

Further, an guide layer is provided near the active layer 4 in Example 19. The guide layer may also be provided below the active layer 4 or at both sides of the active layer 4. FIG. 26 shows a semiconductor laser device wherein a p-type $Ga_{0.6}Al_{0.4}As$ guide layer 12 is located above the active layer 4. And the p-type $Ga_{0.5}Al_{0.5}As$ first cladding layer 13 and a p-type $Ga_{0.8}Al_{0.2}As$ etching stop layer 14 are located on the guide layer 12.

In general, a semiconductor laser device of the structure of FIG. 26 includes a $Ga_{1-X}Al_XAs$ layer 4 as an active layer, a $Ga_{1-Y1}Al_{Y1}As$ layer 13 of a conduction type, provided on at least one of the principal planes of the $Ga_{1-X}Al_XAs$ layer 4, a $Ga_{1-C}Al_CAs$ layer 14 of the conduction type, and a $Ga_{1-Z}Al_ZAs$ layer 6 of the other conduction type than the conduction type of the $Ga_{1-Y1}Al_{Y1}As$ layer 13 A $Ga_{1-D}Al_DAs$ layer 12 is provided near the active layer 4. The $Ga_{1-Z}Al_ZAs$ layer 6 is applied to the $Ga_{1-C}Al_CAs$ layer 14 and has a stripe-like window. A $G_{1-Y2}Al_{Y2}As$ layer 15 of the same conduction type as that of the $Ga_{1-Y1}Al_{Y1}As$ layer 13 is provided in the window. In the structure, the AlAs mole fractions X, Y1, Y2, C and Z has following relations:

$$Z > Y2 > C > X \geq 0,$$

$$Z > Y1 > D > X.$$

Example 20

Further, in the above-mentioned Examples 18, 19, a quantum well structure can also be adopted as an active layer, similarly to Example 17. Then, the operating current can be lowered further, and the optical output can be increased further. Output characteristics similar to those shown in FIG. 23 can be obtained.

In the above-mentioned Examples 1-20, an n-type substrate and an n-type current blocking layer are used. However, a p-type substrate and a p-type current blocking layer can also be used because the AlAs mole fraction of the current blocking layer is large to suppress the diffusion of electrons. On the contrary, in cases of the prior art GaAs current blocking layers displayed in FIGS. 1 and 2, the diffusion length of electrons from the cladding layer into the p-type current blocking layer is 2-3 $\mu$m which is larger than the thickness of the current blocking layers, so that it is difficult to realize a p-type current blocking layer.

In the above-mentioned Examples, the current blocking layer is provided above the active layer or in the opposite side to the substrate with reference to the active layer. However, even if the current blocking layer is provided in the same side as the substrate, the same effects can be obtained. If a double confinement structure is used wherein current blocking layers are provided in the both sides, leak current can be decreased further, and the operating current can be decreased.

Examples 21 and 22

Figure 27:
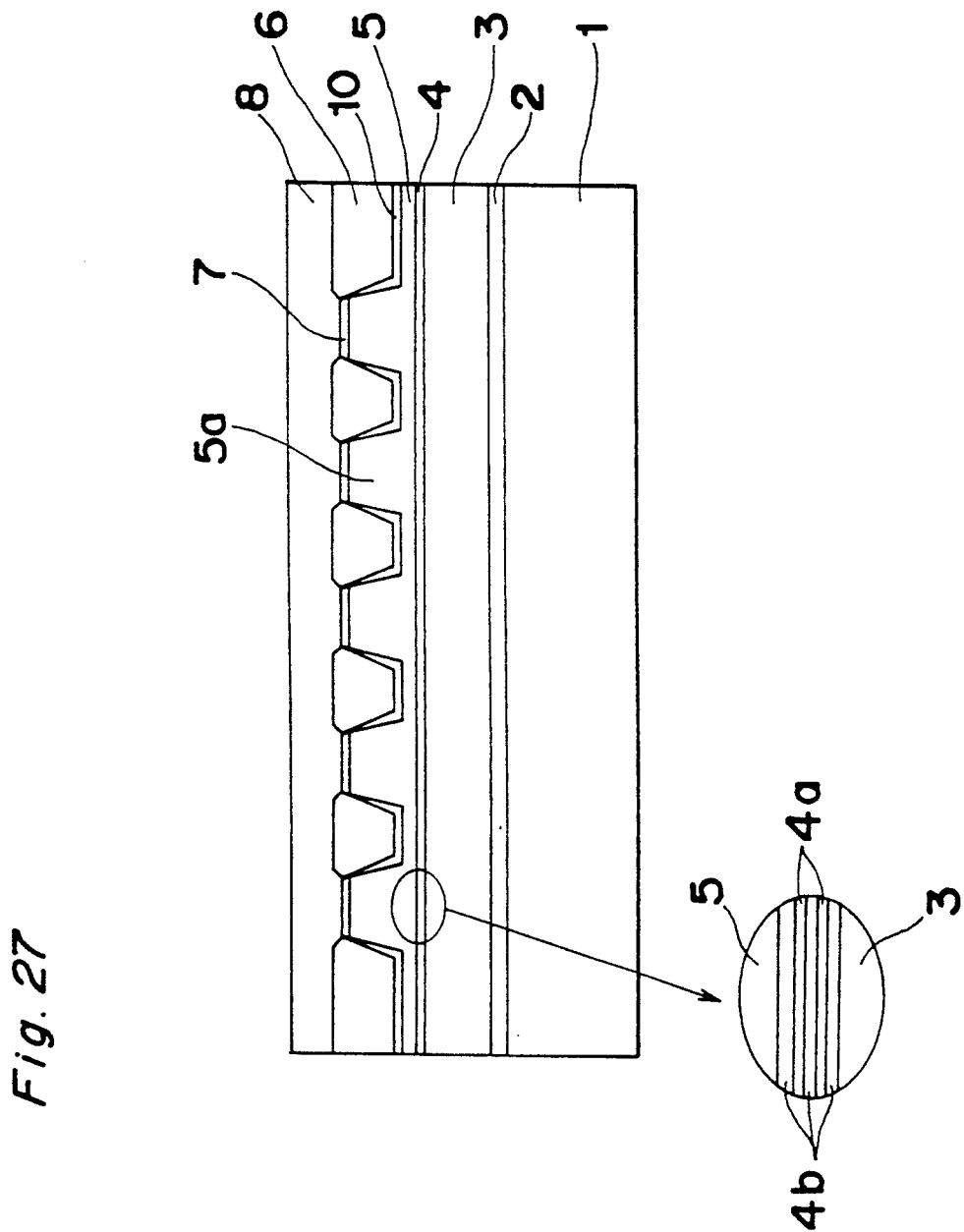
FIG. 27 is a sectional view of a semiconductor laser device of array type according to Example 21.

It is to be noted that if the present invention is applied to all structures based on a structure having a current blocking layer, such as shown in FIGS. 1 and 2, the decrease in operating current or lower noises can be realized. For example, FIGS. 27 and 28 display semiconductor laser arrays of Examples 21 and 22 wherein current channels are aligned in parallel for increasing an output power. In FIG. 27, a plurality of semiconductor laser devices shown in FIG. 8 is arranged in parallel and the active layer 4 has a quantum well structure consisting of well layers 4a and barrier layers 4b interposing the well layers 4a. On the other hand, in FIG. 28, a plurality of semiconductor laser devices shown in FIG. 24 is arranged in parallel and the active layer 4 has a quantum well structure consisting of well layers 4a and barrier layers 4b interposing the well layers 4a. Then, the operating current can be decreased further and the output power can be increased further than that of prior art laser arrays.

Example 23

Figure 29A:
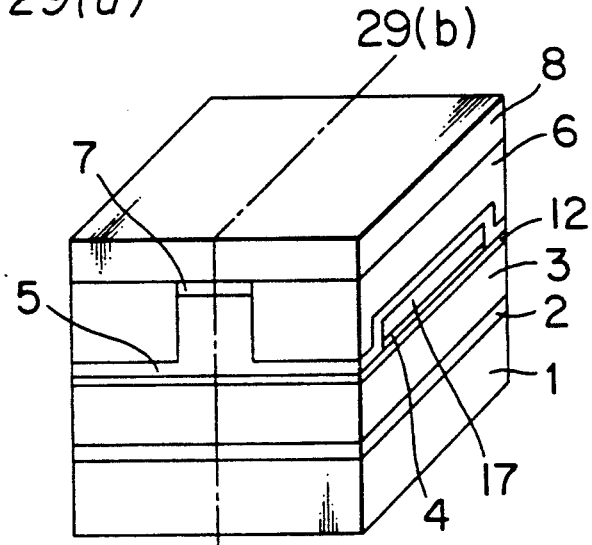
FIG. 29(a) is a perspective view of a semiconductor laser device according to Example 23.
Figure 29B:
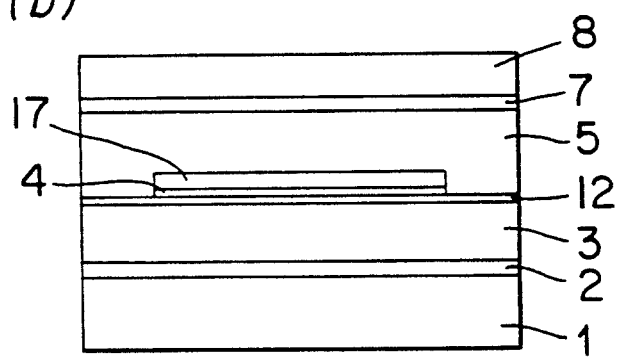
FIG. 29(b) is a sectional view of a semiconductor laser device in a plane 29(b)—29(b) shown in FIG. 29(a)

Next, semiconductor devices are explained wherein a waveguide structure is changed in the direction of cavity. FIG. 29(a) displays a window type high output power laser of Example 23 wherein the active layer 4 near the facet is removed to suppress the optical damage at the end facet. (A window type laser is disclosed in a paper of H. Naito et al., IEEE J. Quantum Electronics 25, 1495 (1989).) FIG. 29(b) shows a section in the resonator direction or in the direction A - A' in FIG. 29(a). A guide layer 12 is applied to an active layer 4, and laser light is emitted through the guide layer 12 from the facets. Then, light is not absorbed in the active layer 4 at the facets, the optical damage of the facets can be prevented. Thus, a high output power can be obtained.

This structure is manufactured as follows: A double heterostructure including an active layer 4 and guide layer 12 is grown on a substrate 1 in the first crystal growth on a substrate 1. That is, an n-type GaAs buffer layer 2, an n-type $Ga_{0.5}Al_{0.5}As$ cladding layer 3, an n-type $Ga_{0.6}Al_{0.4}As$ guide layer 12 an active layer 4, and a p-type protection layer 17 are formed successively on an n-type GaAs substrate 1. In order to protect the active layer 4 from the surface oxidation in the following process, a protection layer 17 is applied to the active layer 4. Then, etching is conducted to the protection layer 17 and the active layer 4 only near the facets. The protection layer 17 consists of one or more p-type GaAlAs layers. For example, the protection layer 17 consists of a p-type GaAlAs layer having a high AlAs mole fraction such as the layer 13 shown in FIG. 15 and another one having a small AlAs mole fraction such as the layer 16 shown in FIG. 24. Next, a p-type cladding layer 5 and a p-type GaAs layer 7 are grown in the regrowth, and a ridge is formed with etching. Then, an n-type $Ga_{0.35}Al_{0.65}As$ current blocking layer 6 is grown selectively to make the surface flat and a p-type GaAs contact layer 8 is grown further.

Example 24

Figure 30:
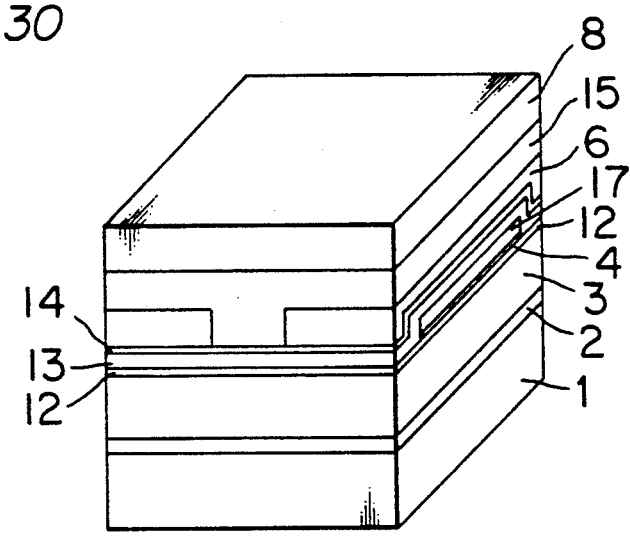
FIG. 30 is a sectional view of another semiconductor laser device of window type according to Example 24.

FIG. 30 shows another Example of a window type laser based on the structure of FIG. 24. In this Example, a double heterostructure of including an active layer 4 is formed in the first crystal growth. That is, an n-type GaAs buffer layer 2, an n-type $Ga_{0.5}Al_{0.5}As$ cladding layer 3, a $Ga_{0.6}Al_{0.4}As$ guide layer 12 an active layer 4, and a p-type protection layer 17 are formed successively on an n-type GaAs substrate 1. Then, etching is conducted to the protection layer 17 and the active layer 4 similarly to Example 23. Then, a p-type $Ga_{0.5}Al_{0.5}As$ cladding layer 13, a p-type $Ga_{0.8}Al_{0.2}As$ etching stop layer 14 and a n-type $Ga_{0.35}Al_{0.65}As$ current blocking layer 6 are formed further. Next, after a stripe is formed in the current blocking layer 6 to the etching stop layer 14, a p-type $Ga_{0.5}Al_{0.5}As$ second cladding layer 15 is grown on the current blocking layer 6 and on the stripe to make the surface flat, and a p-type GaAs contact layer 8 is grown further.

It is to be noted that a guide layer 12 is not necessarily provided in a window structure type laser. For example, a window structure may be formed by impurity diffusion such as Zn or Si into an active layer of quantum well structure only near the end facets to result in a disordered state. The window structures of Examples 23 and 24 can decrease the operating current and increase output power further than those of Examples 23 and 24.

Examples 25 and 26

Figure 31:
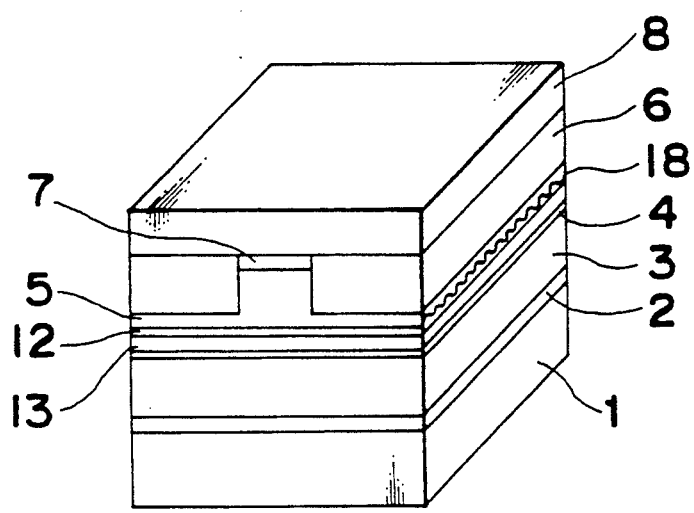
FIG. 31 is a perspective view of a semiconductor laser device of DFB laser type according to Example 25.
Figure 32:
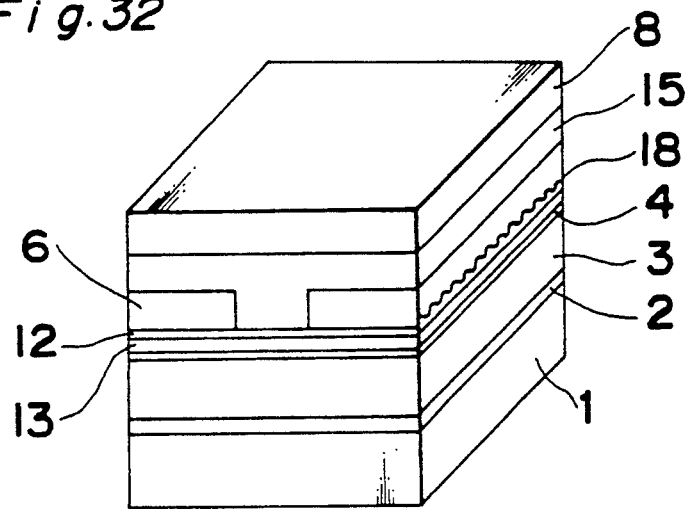
FIG. 32 is a perspective view of another semiconductor laser device of DFB laser type according to Example 26.

Distributed feedback (DFB) lasers having grating along an active layer 4 are shown in FIGS. 31 and 32, wherein a guide layer 12 is formed above the active layer 4 and a grating 18 is formed in the guide layer 12 in structures in correspondence to FIGS. 3 and 24. (A distributed feedback laser is disclosed in a paper of S. Takigawa et al., Appl. Phys. Lett. 52, 1580 (1987).) That is, an n-type GaAs buffer layer 2, an n-type $Ga_{0.5}Al_{0.5}As$ cladding layer 3, an active layer 4, a p-type $Ga_{0.5}Al_{0.5}As$ cladding layer 13 and a $Ga_{0.6}Al_{0.4}As$ guide layer 12 are formed successively on an n-type GaAs substrate 1. A grating 18 is formed on the guide layer 18 with etching. Then, in the structure of FIG. 31, a p-type $Ga_{0.5}Al_{0.5}As$ cladding layer 5 and a p-type GaAs protection layer 7 are provided. After etching a ridge, an n-type $Ga_{0.35}Al_{0.65}As$ current blocking layer 6 is formed, and finally, a p-type GaAs contact layer 8 is formed. In the structure of FIG. 32, after a grating is formed on a guide layer 12 with etching, an n-type $Ga_{0.35}Al_{0.65}As$ current blocking layer 6 is formed. Then, a stripe window is etched in the current blocking layer 6 and a p-type $Ga_{0.5}Al_{0.5}As$ cladding layer 15 and a contact layer 8 are formed successively. Because carriers are confined sufficiently in the active layer 4 by the $Ga_{0.5}Al_{0.5}As$ layer 13, the AlAs mole fraction of the guide layer 12 is set to be 0.3 which makes regrowth easy. A problem of a prior art DFB laser is that when a current is increased, the oscillation mode changes from DFB mode to Fabry-Perot mode because the gain shifts to the longer wavelength side due to heating. In this Example, heating can be decreased because the operating current is decreased compared with a prior art device. Therefore, a DFB laser is obtained which is stable as to wavelength up to a high output power.

Examples 27 and 28

Figure 33:
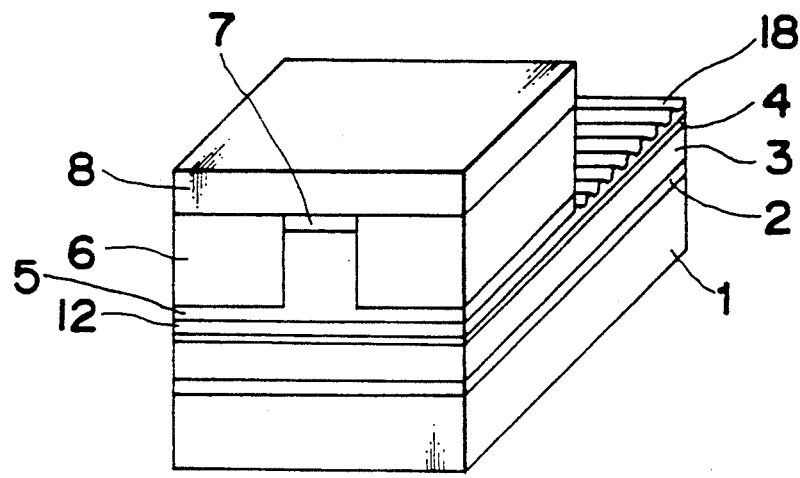
FIG. 33 is a perspective view of a semiconductor laser device of DBR laser type according to Example 27.
Figure 34:
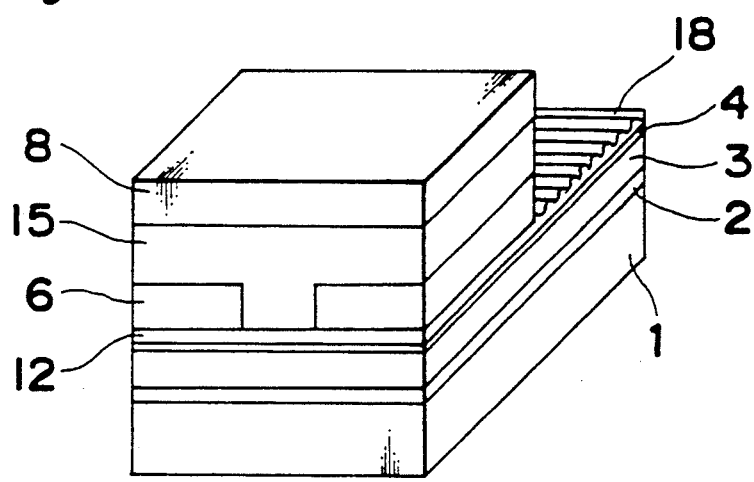
FIG. 34 is a perspective view of another semiconductor laser device of DBR laser type according to Example 28.

Distributed Bragg reflection (DBR) lasers of Examples 27 and 28 are shown in FIGS. 33 and 34. (A distributed Bragg reflection laser is disclosed in a paper of D. F. Welch et al., Electronics Lett. 26, 757 (1990).) The DBR laser displayed in FIG. 33 is based on the structure of FIG. 10, while the other displayed in FIG. 34 is based on the structure of FIG. 26. That is, an n-type GaAs buffer layer 2, an n-type $Ga_{0.5}Al_{0.5}As$ cladding layer 3, an active layer 4 and a $Ga_{0.6}Al_{0.4}As$ guide layer 12 a p-type $Ga_{0.5}Al_{0.5}As$ second cladding layer 5 and a p-type GaAs protection layer 7 are formed successively on an n-type GaAs substrate 1. After, an etching of a ridge, an n-type $Ga_{0.35}Al_{0.65}As$ current blocking layer 6 is formed, and a p-type GaAs contact layer 8 is formed. Finally, a facet region is etched to the guide layer 12 and a grating 18 is formed on the guide layer 12. In the structure of FIG. 34, a current blocking layer 6 having a stripe window is formed, and a p-type $Ga_{0.5}Al_{0.5}As$ second cladding layer 15 and a p-type GaAs contact layer 8 are formed successively. Finally, a facet region is etched to the guide layer 12 and a grating 18 is formed on the guide layer 12. In the DBR lasers of the present invention, the operating current can be decreased, and a DBR laser is stable as to wavelength up to a high output power.

If the period of the grating 18 is secondary, a laser which can conduct surface emitting can be obtained. A problem of a prior art surface emitting type laser is that a high output power is difficult to be obtained due to high thermal resistance. In these Examples, a low operating current and a high output power can be obtained.

Examples 29 and 30

Figure 35:
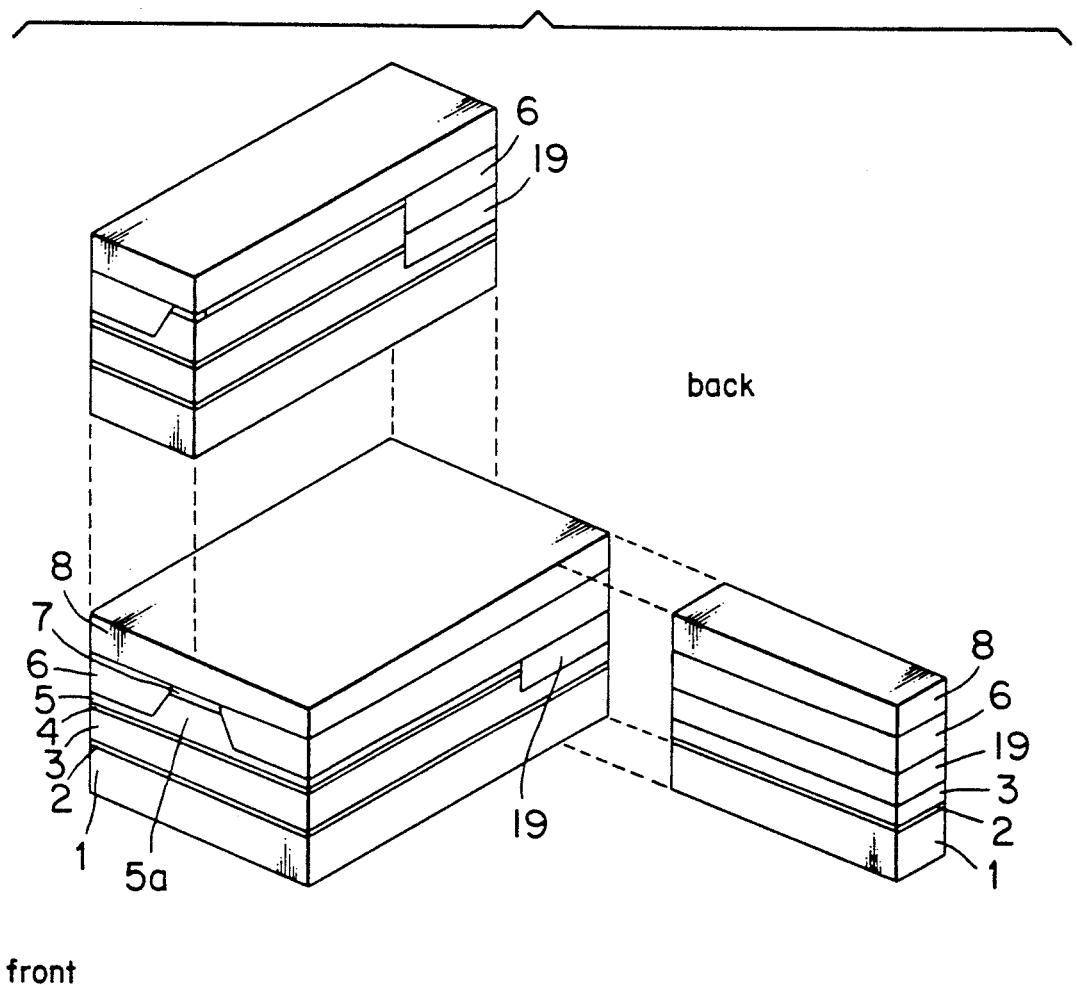
FIG. 35 is a perspective view of a superluminescent diode according to Example 29.
Figure 36:
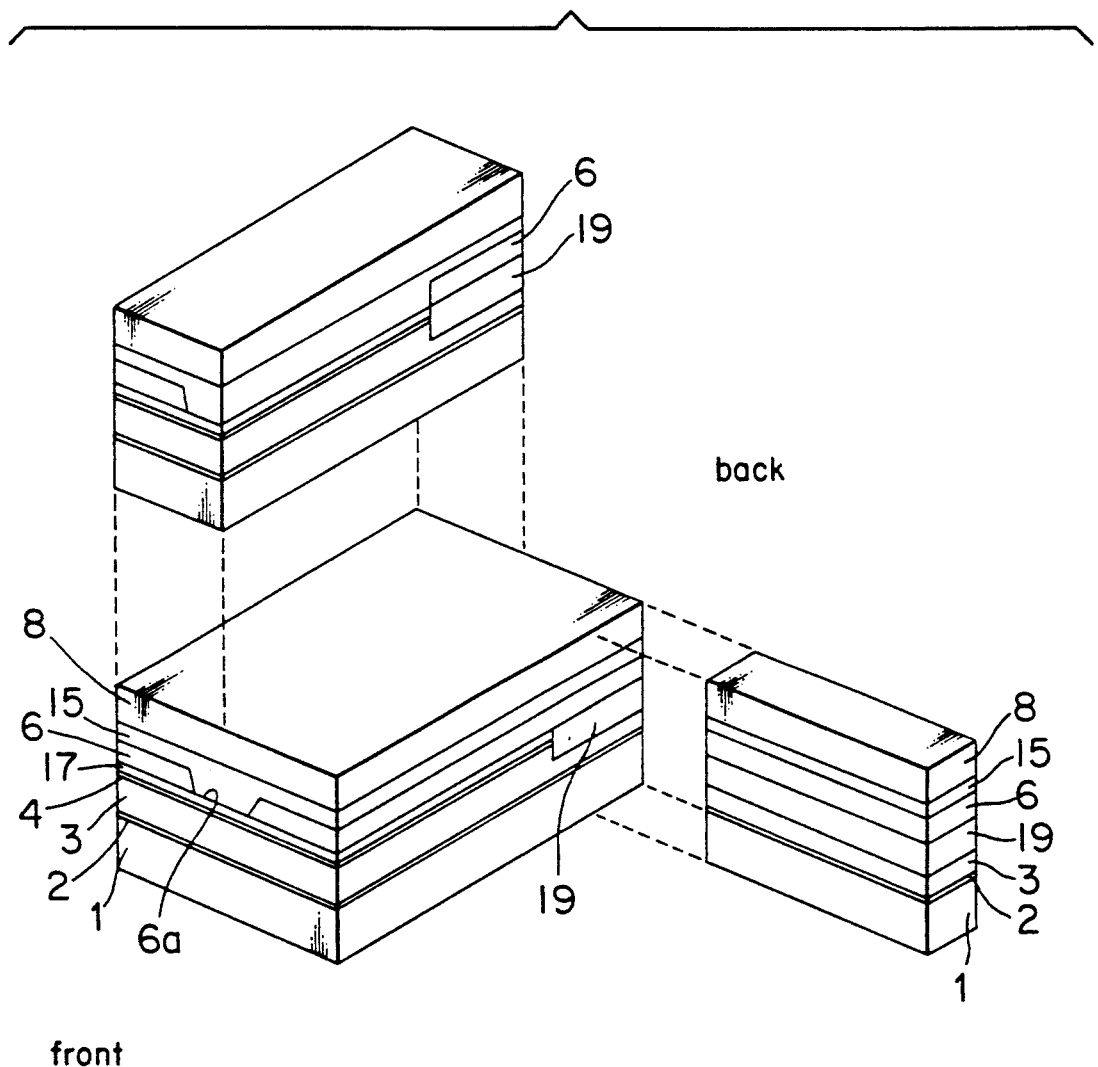
FIG. 36 is a perspective view of another superluminescent diode according to Example 30.

FIGS. 35 and 36 show superluminescent diodes (SLD) which can be made by lowering the reflectance at the rear facet. (A superluminescent diode is disclosed in a paper of K. Tateoka et al., IEEE J. Quantum Electronics 27, 1568 (1991).) sections in the cavity direction and sections in the rear side thereof are also shown. The structures displayed in FIGS. 35(a), 35(b), 35(c), 36(a), 36(b) and 36(c) are based on the structure of FIGS. 3 and 24. In the structures displayed in FIGS. 35(a), 35(b), 36(a), 36(b) and 36(c), etching is conducted near the rear facet of the devices in order to decrease the reflection at the rear facet. Then, light is not guided near the rear facet so that the reflection at the rear facet can be decreased largely or SLD characteristics can be obtained.

The device of Example 29 is manufactured as follows: An-type GaAs buffer layer 2, an n-type $Ga_{0.5}Al_{0.5}As$ cladding layer 3, an active layer 4, a p-type $Ga_{0.5}Al_{0.5}As$ cladding layer 5 and a p-type GaAs protection layer 7 are formed successively on an n-type GaAs substrate 1 in the first crystal growth. Then, a dielectric layer (not shown) such as a nitride film is formed except a rear part, and the rear part is etched to the n-type GaAlAs cladding layer 3. Next, a imbedded GaAlAs layer 19 is grown selectively on the etched part. The AlAs mole fraction of the imbedded layer 19 is preferably selected so that the effective refractive index in the rear part is the same as that in the other part in order to decrease the reflection at the interface of imbedding mostly. Then, a stripe-like dielectric film (not shown) is formed except the rear part and a ridge 5a is formed with etching. Next, a GaAlAs current blocking layer 6 is grown selectively on the etched part. Then, a p-type GaAs contact layer 8 is grown on the entire plane to make the surface flat.

The other SLD shown in FIG. 36(a), 36(b) and 36(c) is manufactured as follows: An-type GaAs buffer layer 2, an n-type $Ga_{0.5}Al_{0.5}As$ cladding layer 3, an active layer 4 and a p-type GaAs protection layer 17 of the active layer 4 consisting of at least one layer are formed successively on an n-type GaAs substrate 1 in the first crystal growth. Then, a rear part is etched and a GaAlAs imbedded layer 19 is grown selectively on the etched part similarly as in Example 29. Next, a GaAlAs current blocking layer 6 is grown selectively on the etched part, and it is etched like a stripe except the rear part. Then, a p-type GaAlAs second cladding layer 15 is grown further. Finally, a GaAs contact layer 8 is grown on the entire plane to make the surface flat.

According to Examples 29 and 30, a superluminescent diode of low operating current can be obtained.

As to the structure of superluminescent diode, other techniques may be used. For example, a unti-reflection coating is formed, or a stripe is tilted by several degrees to the facet, in order to lower the reflection at the facets.

Further, other Examples may also be adopted at the same time. For example, if the window structures are aligned, the output power can be increased further.

Needless to say, similar effects can be obtained by using another material such as InP, InGaAlP, InGaAlAs or ZnSe for a current blocking layer which does not absorb laser light and has a lower refractive index than that of the cladding layer.

As explained above, in a semiconductor laser device according to the present invention, a $Ga_{1-Z}Al_ZAs$ layer of a conduction type having a stripe-like window is provided at least on a side of an active layer, and a $Ga_{1-Y}Al_YAs$ layer of the other conduction type than that of the $Ga_{1-Z}Al_ZAs$ layer is provided in a region except the window, wherein Z is larger than Y. Thus, noises are lower and the operating current is lower largely than those of prior art.

That is, because the AlAs mole fraction Z of the current blocking layer is higher than Y of the cladding layer, the laser oscillates in a single lateral mode, and laser light is not absorbed by the current blocking layer. Then, the loss in the waveguide can be decreased largely and the operating current can be decreased largely.

Further, because light extends into the current blocking layer and in the active layer located below the current blocking layer, the spectrum is likely to become multimode, and low noise characteristics can be obtained even the distance between the active layer and the current blocking layer is decreased compared with a prior art device.

Further, because light is not absorbed by the current blocking layer, the stripe width can be narrowed more.

As mentioned above, the leak current can be decreased and the stripe width can be decreased. Thus, a size which can lower the operating current can be adopted, the operating current can be decreased still further, favorably as a low noise laser for a compact disc.

The lowering of the operating current brings about the lowering of the heating in the active layer. Then, a higher optical output can be realized. Especially, a higher output power is obtained by making the active layer thinner.

If a semiconductor laser device according to the present invention is used as an optical source of a optical disc, a high frequency superimposing circuit for decreasing noises on reading can be omitted, and the size of a pickup can be realized.

Further, the decrease in operating current causes the decrease in heat at a laser mount, and a small and light heat sink can be used. Then, a laser package can be made of resin whereas it is made of metal priory, and the size of pickup can be decreased largely and the cost of pickup can be decreased.

By using a quantum well structure as an active layer, a semiconductor laser device of lower operating current can be obtained. Then, a laser device which can oscillate in single mode at 200 mW can be made easily.

Further, devices such as an array-type laser, a window type laser, a distributed feedback laser, a distributed Bragg laser and a superluminescent diode can be operated at a lower operating current, and the output power can be increased further.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor laser device, comprising:
a $Ga_{1-X}Al_XAs$ layer as an active layer;
a $Ga_{1-Y}Al_YAs$ layer of a conduction type, provided on at least one side of the principal planes of the $Ga_{1-X}Al_XAs$ layer, which $Ga_{1-Y}Al_YAs$ layer having a stripe-like current channel portion extending in a direction opposite to the active layer; and
a $Ga_{1-Z}Al_ZAs$ layer of the other conduction type than the conduction type of the $Ga_{1-Y}Al_YAs$ layer, which $Ga_{1-Z}Al_ZAs$ layer being provided on the two sides in the longitudinal direction of the stripe-like current channel portion of the $Ga_{1-Y}Al_YAs$ layer;
wherein the AlAs mole fractions X, Y and Z has a following relation:

$$Z > Y > X \geq 0.$$

2. A semiconductor laser device, comprising:
a $Ga_{1-X}Al_XAs$ layer as an active layer;
a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided on the two sides in the longitudinal direction of the stripe-like current channel portion; and
a $GA_{1-B}Al_BAs$ layer of 0.1 μm or less of thickness of the same conduction type as the conduction type of the $Ga_{1-Y}Al_YAs$ layer, which $Ga_{1-B}Al_BAs$ layer being provided between the $Ga_{1-Y}Al_YAs$ layer and the $Ga_{1-Z}Al_ZAs$ layer;
wherein the AlAs mole fractions X, Y, Z and B has following relations:

$$Z > Y > X \geq 0$$

and $$B > X.$$

3. A semiconductor laser device, comprising:
a $Ga_{1-X}Al_XAs$ layer as an active layer;
a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion; and
one or more $Ga_{1-E}Al_EAs$ layers provided on the $Ga_{1-Z}Al_ZAs$ layer, wherein the AlAs mole fractions X, Y, Z and E has following relations:

$$Z > Y > X \geq 0,$$

and $$Z > E \geq 0.$$

4. A semiconductor laser device, comprising:
a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion; and
a $Ga_{1-D}Al_DAs$ layer applied to the $Ga_{1-X}Al_XAs$ layer;
wherein the AlAs mole fractions X, Y, Z and D has a following relation:

$$Z > Y > D > X \geq 0.$$

5. A semiconductor laser device, comprising:
a $Ga_{1-X}Al_XAs$ layer as an active layer;
a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;
a $Ga_{1-B}Al_BAs$ layer of 0.1 μm or less of thickness of the same conduction type as the conduction type of the $Ga_{1-Y}Al_YAs$ layer, which $Ga_{1-B}Al_BAs$ layer being provided between the $Ga_{1-Y}Al_YAs$ layer and the $Ga_{1-Z}Al_ZAs$ layer; and one or more $Ga_{1-E}Al_EAs$ layers provided on the $Ga_{1-Z}Al_ZAs$ layer, wherein the AlAs mole fractions X, Y, Z, B and E has following relations:

$Z>Y>X\geq0$, $Z>E\geq0$ and $B>X$.

6. A semiconductor laser device, comprising:

a $Ga_{1-X}Al_XAs$ layer as an active layer;

a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;

a $Ga_{1-B}Al_BAs$ layer of 0.1 μm or less of thickness of the same conduction type as the conduction type of the $Ga_{1-Y}Al_YAs$ layer, which $Ga_{1-B}Al_BAs$ layer being provided between the $Ga_{1-Y}Al_YAs$ layer and the $Ga_{1-Z}Al_ZAs$ layer; and a $Ga_{1-D}Al_DAs$ layer applied to the $Ga_{1-X}Al_XAs$ layer;

wherein the AlAs mixed crystal ratios X, Y, Z, B and D has following relations:

$Z>Y>D>X\geq0$ and $B>X$.

7. A semiconductor laser device, comprising:

a $Ga_{1-X}Al_XAs$ layer as an active layer;

a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;

one or more $Ga_{1-E}Al_EAs$ layers provided on the $Ga_{1-Z}Al_ZAs$ layer; and a $Ga_{1-D}Al_DAs$ layer applied to the $Ga_{1-X}Al_XAs$ layer;

wherein the AlAs mole fractions X, Y, Z, D and E has following relations:

$Z>Y>D>X\geq0$ and $Z>E\geq0$.

8. A semiconductor laser device, comprising:

a $Ga_{1-X}Al_XAs$ layer as an active layer;

a $Ga_{1-Y}Al_YAs$ layer of a conduction type, provided on at least one of the principal planes of the $Ga_{1-X}Al_XAs$ layer, which $Ga_{1-Y}Al_YAs$ layer having a stripe-like current channel portion extending in a direction opposite to the active layer;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;

a $Ga_{1-B}Al_BAs$ layer of 0.1 μm or less of thickness of the same conduction type as the conduction type of the $Ga_{1-Y}Al_YAs$ layer, which $Ga_{1-B}Al_BAs$ layer being provided between the As layer and the $Ga_{1-Z}Al_ZAs$ layer;

one or more $Ga_{1-E}Al_EAs$ layers provided on the $Ga_{1-Z}Al_ZAs$ layer; and a $Ga_{1-D}Al_DAs$ layer applied to the $Ga_{1-X}Al_XAs$ layer;

wherein the AlAs mole fractions X, Y, Z, B, D and E has following relations:

$Z>Y>D>X\geq0$, $Z>E\geq0$ and $B>X$.

9. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ layer;

a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion; and a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;

wherein the AlAs mole fractions X, Y1, Y2, C and Z has following relations:

$Z>Y2>C>X\geq0$, and $Z>Y1>X$.

10. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion; and a $Ga_{1-B}Al_BAs$ layer of 0.1 μm or less of thickness of the same conduction type as the conduction type of the $Ga_{1-Y}Al_YAs$ layer, which $Ga_{1-B}Al_BAs$ layer being provided between the $Ga_{1-Y}Al_YAs$ layer and the $Ga_{1-Z}Al_ZAs$ layer;

wherein the AlAs mole fractions X, Y1, Y2, B, C and Z has following relations:

$$Z > Y2 > C > X \geq 0,$$
$$Z > Y1 > X$$

and $$B > X.$$

11. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion; and one or more $Ga_{1-E}Al_EAs$ layers provided on the $Ga_{1-Z}Al_ZAs$ layer;

wherein the AlAs mole fractions X, Y1, Y2, C and Z has following relations:

$$Z > Y2 > C > X \geq 0,$$
$$Z > E \geq 0$$

and $$Z > Y1 > X.$$

12. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion; and a $Ga_{1-D}Al_DAs$ layer applied to the $Ga_{1-X}Al_XAs$ layer; Z has following relations:

$$Z > Y2 > C > X \geq 0$$

and $$Z > Y1 > D > X.$$

13. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;

a $Ga_{1-B}Al_BAs$ layer of 0.1 μm or less of thickness of the same conduction type as the conduction type of the $Ga_{1-Y}Al_YAs$ layer, which $Ga_{1-B}Al_BAs$ layer being provided between the $Ga_{1-Y}Al_YAs$ layer and the $Ga_{1-Z}Al_ZAs$ layer; and one or more $Ga_{1-E}Al_EAs$ layers provided on the $Ga_{1-Z}Al_ZAs$ layer;

wherein the AlAs mole fractions X, Y1, Y2, B, C, E and Z has following relations:

$$Z > Y2 > C > X \geq 0,$$
$$Z > E \geq 0,$$
$$Z > Y1 > X$$

and $$B > X.$$

14. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;

a $Ga_{1-B}Al_BAs$ layer of 0.1 μm or less of thickness of the same conduction type as the conduction type of the layer, which $Ga_{1-B}Al_BAs$ layer being provided between the $Ga_{1-Y}Al_YAs$ layer and the $Ga_{1-Z}Al_ZAs$ layer; and a $Ga_{1-D}Al_DAs$ layer applied to the $Ga_{1-X}Al_XAs$ layer;

wherein the AlAs mole fractions X, Y1, Y2, B, C, D and Z has following relations:

$$Z > Y2 > C > X \geq 0,$$
$$Z > Y1 > D > X$$

and $$B > X.$$

15. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;

one or more $Ga_{1-E}Al_EAs$ layers provided on the $Ga_{1-Z}Al_ZAs$ layer; and a $Ga_{1-D}Al_DAs$ layer applied to the $Ga_{1-X}Al_XAs$ layer;

wherein the AlAs mole fractions X, Y1, Y2, C, D, E and Z has following relations:

$$Z > Y2 > C > X \geq 0,$$

$$Z > E \geq 0,$$

and
$$Z > Y1 > D > X.$$

16. A semiconductor laser device, comprising:

a $Ga_{1-X}Al_XAs$ layer as an active layer;

a $Ga_{1-Y1}Al_{Y1}As$ layer of a conduction type, provided on at least one of the principal planes of the $Ga_{1-X}Al_XAs$ layer;

a $Ga_{1-C}Al_CAs$ layer of the conduction type applied to the $Ga_{1-Y1}Al_{Y1}As$ layer;

a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;

a $Ga_{1-B}Al_BAs$ layer of 0.1 μm or less of thickness of the same conduction type as the conduction type of the $Ga_{1-Y}Al_YAS$ layer, which $Ga_{1-B}Al_BAs$ layer being provided between the $Ga_{1-Y}Al_YAs$ layer and the $Ga_{1-Z}Al_ZAs$ layer;

one or more $Ga_{1-E}Al_EAs$ layers provided on the $Ga_{1-Z}Al_ZAs$ layer; and a $Ga_{1-D}Al_DAs$ layer applied to the $Ga_{1-X}Al_XAs$ layer;

wherein the AlAs mixed crystal ratios X, Y1, Y2, B, C, D, E and Z has following relations:

$$Z > Y2 > C > X \geq 0,$$
$$Z > E \geq 0,$$
$$Z > Y1 > D > X$$
and
$$B > X.$$

and $$B > X.$$

17. A semiconductor laser device, comprising:

an active layer having a quantum well structure;

a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer; and a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;

wherein the AlAs mole fractions Y and Z has a following relation:

$$Z > Y \text{ where } Y > 0.$$

18. A semiconductor laser device, comprising:

an active layer having a quantum well structure;

a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion; and a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer;

wherein the AlAs mole fractions Y and Z has a following relation:

$$Z > Y \text{ where } Y > 0.$$

19. A semiconductor laser device, comprising:

an active layer having a quantum well structure;

a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion; and one or more $Ga_{1-E}Al_EAs$ layers provided on the $Ga_{1-Z}Al_ZAs$ layer;

wherein the AlAs mole fractions Y, Z and E has following relations:

$$Z > Y \text{ where } Y > 0$$

and $$Z > E \geq 0.$$

20. A semiconductor laser device, comprising:

an active layer having a quantum well structure;

a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;

a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion; and a $Ga_{1-D}Al_DAs$ layer applied to the active layer;

wherein the AlAs mole fractions Y, Z and D has a following relation:

$$Z > Y > D \text{ where } D > 0.$$

21. A semiconductor laser device, comprising:
an active layer having a quantum well structure;
a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;
a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer; and
one or more $Ga_{1-E}Al_EAs$ layers provided on the $Ga_{1-Z}Al_ZAs$ layer;
wherein the AlAs mole fractions Y, Z and E has a following relations:

$Z > Y$ where $Y > 0$ and $Z > E \geq 0$.

22. A semiconductor laser device, comprising:
an active layer having a quantum well structure;
a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;
a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer; and
a $Ga_{1-D}Al_DAs$ layer applied to the active layer;
wherein the AlAs mole fractions Y, Z and D has a following relation:

$Z > Y > D$ where $D > 0$.

23. A semiconductor laser device, comprising:
an active layer having a quantum well structure;
a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;
one or more $Ga_{1-E}Al_EAs$ layers provided on the $Ga_{1-Z}Al_ZAs$ layer;
a $Ga_{1-D}Al_DAs$ layer applied to the active layer;
wherein the AlAs mole fractions Y, Z, D and E has following relations:

$Z > Y > D$ where $D > 0$ and $Z > E \geq 0$.

24. A semiconductor laser device, comprising:
an active layer having a quantum well structure;
a $Ga_{1-Y}Al_YAs$ layer of a conduction type, provided on at least one of the principal planes of the active layer, which $Ga_{1-Y}Al_YAs$ layer having a stripe-like current channel portion extending in a direction opposite to the active layer;
a $Ga_{1-Z}Al_ZAs$ layer of the other conduction type than the conduction type of the $Ga_{1-Y}Al_YAs$ layer, which $Ga_{1-Z}Al_ZAs$ layer being provided along the two sides in the longitudinal direction of the stripe-like current channel portion;
a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer;
one or more $Ga_{1-E}Al_EAs$ layers provided on the $Ga_{1-Z}Al_ZAs$ layer; and
a $Ga_{1-D}Al_DAs$ layer applied to the layer;
wherein the AlAs mole fractions Y, Z, D and E has following relations:

$Z > Y > D$ where $D > 0$ and $Z > E \geq 0$.

25. A semiconductor laser device, comprising:
an active layer having a quantum well structure;
a $Ga_{1-Y1}Al_{Y1}As$ layer of a conduction type, provided on at least one of the principal planes of the active layer;
a $Ga_{1-C}Al_CAs$ layer of the conduction type applied to the $Ga_{1-Y1}Al_{Y1}As$ layer;
a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion; and
a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;
wherein the AlAs mole fractions Y1, Y2, C and Z has following relations:

$Z > Y_2 > C$ and $Z > Y_1$ where $C > 0 > 1 > 0$ and $D > 0$

26. A semiconductor laser device, comprising:
an active layer having a quantum well structure;
a $Ga_{1-Y1}Al_{Y1}As$ layer of a conduction type, provided on at least one of the principal planes of the active layer;
a $Ga_{1-C}Al_CAs$ layer of the conduction type applied to a $Ga_{1-Y2}Al_{Y2}As$ layer of the conduction type, applied to the $Ga_{1-C}Al_CAs$ layer, which $Ga_{1-}$ $Ga_{1-Y2}Al_{Y2}As$ layer being a stripe-like current channel portion;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion; and a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer;

wherein the AlAs mole fractions Y1, Y2, C and Z has following relations:

$Z > Y2 > C$ and $Z > Y1$ where $C > 0$, $y1 > 0$ and $D > 0$.

27. A semiconductor laser device, comprising:
an active layer having a quantum well structure;
a $Ga_{1-Y1}Al_{Y1}As$ layer of a conduction type, provided on at least one of the principal planes of the active layer;
a $Ga_{1-C}Al_CAs$ layer of the conduction type applied to the $Ga_{1-Y1}Al_{Y1}As$ layer;
a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;
a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion; and
one or more $Ga_{1-E}Al_EAs$ layers provided on the $Ga_{1-Z}Al_ZAs$ layer;
wherein the AlAs mole fractions Y1, Y2, C, E and Z has following relations:

$Z > Y2 > C$, $Z > E \geq 0$ and $Z > Y1$ where $C > 0$, $y1 > 0$, and $D > 0$.

28. A semiconductor laser device, comprising:
an active layer having a quantum well structure;
a $Ga_{1-Y1}Al_{Y1}As$ layer of a conduction type, provided on at least one of the principal planes of the active layer;
a $Ga_{1-C}Al_CAs$ layer of the conduction type applied to the $Ga_{1-Y1}Al_{Y1}As$ layer;
a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;
a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion; and
a $Ga_{1-D}Al_DAs$ layer applied to the active layer;
wherein the AlAs mole fractions Y1, Y2, C, D and Z has following relations:

$Z > Y2 > C$, and $Z > Y1 > D$ where $C > 0$, $y1 > 0$, and $D > 0$.

29. A semiconductor laser device, comprising:
an active layer having a quantum well structure;
a $Ga_{1-Y1}Al_{Y1}As$ layer of a conduction type, provided on at least one of the principal planes of the active layer;
a $Ga_{1-C}Al_CAs$ layer of the conduction type applied to the $Ga_{1-Y1}Al_{Y1}As$ layer;
a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;
a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;
a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer; and
one or more $Ga_{1-E}Al_EAs$ layers provided on the $Ga_{1-Z}Al_ZAs$ layer;
wherein the AlAs mole fractions Y1, Y2, C, E and Z has following relations:

$Z > Y2 > C$, $Z > E \geq 0$ and $Z > Y1 > C$ where $C > 0$, $y1 > 0$, and $D > 0$.

30. A semiconductor laser device, comprising:
an active layer having a quantum well structure;
a $Ga_{1-Y1}Al_{Y1}As$ layer of a conduction type, provided on at least one of the principal planes of the active layer;
a $Ga_{1-C}Al_CAs$ layer of the conduction type applied to the $Ga_{1-Ya}Al_{Y1}As$ layer;
a $Ga_{1-Y2}Al_{Y2}As$ layer of the conduction type, applied to the $Ga_{1-C}Al_CAs$ layer, which $Ga_{1-Y2}Al_{Y2}As$ layer being a stripe-like current channel portion;
a $Ga_{1-Z}Al_ZAs$ layer of the other conduction type than the conduction type of the $Ga_{1-Y1}Al_{Y1}As$ layer, which $Ga_{1-Z}Al_ZAs$ layer being provided along the two sides in the longitudinal direction of the stripe-like current channel portion;
a GaAlAs layer of 0.1 μm or less of thickness of the same conduction type as the conduction type of the $Ga_{1-Y}Al_YAs$ layer, which GaAlAs layer being provided between the $Ga_{1-Y}Al_YAs$ layer and the $Ga_{1-Z}Al_ZAs$ layer; and
a $Ga_{1-D}Al_DAs$ layer applied to the active layer;
wherein the AlAs mole fractions Y1, Y2, C, D and Z has following relations:

$Z > Y2 > C$ and $Z > Y1 > D$ where $C > 0$, $y1 > 0$, and $D > 0$.

31. A semiconductor laser device, comprising:

an active layer having a quantum well structure;
a $Ga_{1-y1}Al_{y1}As$ layer of a conduction type, provided on at least one of the principal planes of the active layer;
a $Ga_{1-C}Al_{C}As$ layer of the conduction type applied to the $Ga_{1-y1}Al_{y1}As$ layer;
a $Ga_{1-y2}Al_{y2}As$ layer of the conduction type, applied to the $Ga_{1-C}Al_{C}As$ layer, which $Ga_{1-y2}Al_{y2}As$ layer being a stripe-like current channel portion;
a $Ga_{1-z}Al_{z}As$ layer of the other conduction type than the conduction type of the $Ga_{1-y1}Al_{y1}As$ layer, which $Ga_{1-z}Al_{z}As$ layer being provided along the two sides in the longitudinal direction of the stripe-like current channel portion;
one or more $Ga_{1-E}Al_{E}As$ layers provided on the $Ga_{1-z}Al_{z}As$ layer; and
a $Ga_{1-D}Al_{D}As$ layer applied to the active layer;
wherein the AlAs mole fractions Y1, Y2, C, D, E and Z has following relations:

$Z>Y2>C,$ $Z>E\geq 0$ and $Z>Y>D$ where $C>0$, $y1>0$, and $D>0$.

32. A semiconductor laser device, comprising:
an active layer having a quantum well structure;
a $Ga_{1-y1}Al_{y1}As$ layer of a conduction type, provided on at least one of the principal planes of the active layer;
a $Ga_{1-C}Al_{C}As$ layer of the conduction type applied to the $Ga_{1-y1}Al_{y1}As$ layer;
a $Ga_{1-y2}Al_{y2}As$ layer of the conduction type, applied to the $Ga_{1-C}Al_{C}As$ layer, which $Ga_{1-y2}Al_{y2}As$ layer being a stripe-like current channel portion;
the conduction type of the $Ga_{1-y1}Al_{y1}As$ layer, which $Ga_{1-z}Al_{z}As$ layer being provided along the two sides in the longitudinal direction of the stripe-like current channel portion;
a GaAlAs layer of 0.1 μm or less of thickness of the same conduction type as the conduction type of the $Ga_{1-y}Al_{y}As$ layer, which GaAlAs layer being provided between the $Ga_{1-y}Al_{y}As$ layer and the $Ga_{1-z}Al_{z}As$ layer;
one or more $Ga_{1-E}Al_{E}As$ layers provided on the $Ga_{1-z}Al_{z}As$ layer;
a $Ga_{1-D}Al_{D}As$ layer applied to the active layer;
wherein the AlAs mole fractions Y1, Y2, C, D, E and Z has following relations:

$Z>Y2>C,$ $Z>E\geq 0$ and $Z>Y1>D$ where $C>0$, $y1>0$, and $D>0$.

33. A semiconductor laser device, comprising:
a $Ga_{1-X}Al_{X}As$ layer as an active layer;
a $Ga_{1-y1}Al_{y1}As$ layer of a conduction type, provided on at least one of the principal planes of the $Ga_{1-X}Al_{X}As$ layer;
a $Ga_{1-C}Al_{C}As$ layer of the conduction type, applied to the $Ga_{1-y1}Al_{y1}As$ layer;
a $Ga_{1-z}Al_{z}As$ layer of the other conduction type than the conduction type of the $Ga_{1-y1}Al_{y1}As$ layer, which $Ga_{1-z}Al_{z}As$ layer being applied to the $Ga_{1-C}Al_{C}As$ layer, which $Ga_{1-z}Al_{z}As$ layer having a stripe-like window; and
a $Ga_{1-y2}Al_{y2}As$ layer of the same conduction type as that of the $Ga_{1-y1}Al_{y1}As$ layer, which $Ga_{1-y2}Al_{y2}As$ layer being provided in the window;
wherein the AlAs mole fractions X, Y1, Y2, C and Z has following relations:

$Z>Y2>C>X\geq 0,$ and $Z>Y1>X.$

34. A semiconductor laser device, comprising:
a $Ga_{1-X}Al_{X}As$ layer as an active layer;
a $Ga_{1-y1}Al_{y1}As$ layer of a conduction type, provided on at least one of the principal planes of the $Ga_{1-X}Al_{X}As$ a $Ga_{1-C}Al_{C}As$ layer of the conduction type, applied to the $Ga_{1-y1}Al_{y1}As$ layer;
a $Ga_{1-z}Al_{z}As$ layer of the other conduction type than the conduction type of the $Ga_{1-y1}Al_{y1}As$ layer, which $Ga_{1-z}Al_{z}As$ layer being applied to the $Ga_{1-C}Al_{C}As$ layer, which $Ga_{1-z}Al_{z}As$ layer having a stripe-like window;
a $Ga_{1-y2}Al_{y2}As$ layer of the same conduction type as that of the $Ga_{1-y1}Al_{y1}As$ layer, which $Ga_{1-y2}Al_{y2}As$ layer being provided in the window; and
a $Ga_{1-D}Al_{D}As$ layer applied to the active layer;
wherein the AlAs mole fractions X, Y1, Y2, C, D and Z has following relations:

$Z>Y2>C>X\geq 0$ and $Z>Y1>D>X.$

35. A semiconductor laser device, comprising:
an active layer having a quantum well structure;
a $Ga_{1-y1}Al_{y1}As$ layer of a conduction type, provided on at least one of the principal planes of the active layer;
a $Ga_{1-C}Al_{C}As$ layer of the conduction type, applied the $Ga_{1-y1}Al_{y1}As$ layer;
a $Ga_{1-z}Al_{z}As$ layer of the other conduction type than the conduction type of the $Ga_{1-y1}Al_{y1}As$ layer, which $Ga_{1-z}Al_{z}As$ layer being applied to the $Ga_{1-C}Al_{C}As$ layer, which $Ga_{1-z}Al_{z}As$ layer having a stripe-like window; and
a $Ga_{1-y2}Al_{y2}As$ layer of the same conduction type as that of the $Ga_{1-y1}Al_{y1}As$ layer, which $Ga_{1-y2}Al_{y2}As$ layer being provided in the window;
wherein the AlAs mole fractions Y1, Y2, C and Z has following relations:

$Z>Y2>C,$ and $Z>Y1$ where $C>0$, $y1>0$, and $D>0$.

36. A semiconductor laser device, comprising:
an active layer having a quantum well structure;
a $Ga_{1-y1}Al_{y1}As$ layer of a conduction type, provided on at least one of the principal planes of the active layer;

a $Ga_{1-C}Al_CAs$ layer of the conduction type, applied to the $Ga_{1-Y1}Al_{Y1}As$ layer;

a $Ga_{1-Z}Al_ZAs$ layer of the other conduction type than the conduction type of the $Ga_{1-Y1}Al_{Y1}As$ layer, which $Ga_{1-Z}Al_ZAs$ layer being applied to the $Ga_{1-C}Al_CAs$ layer, which $Ga_{1-Z}Al_ZAs$ layer having a stripe-like window;

a $Ga_{1-Y2}Al_{Y2}As$ layer of the same conduction type as that of the $Ga_{1-Y1}Al_{Y1}As$ layer, which $Ga_{1-Y2}Al_{Y2}As$ layer being provided in the window; and a $Ga_{1-D}Al_DAs$ layer applied to the active layer;

wherein the AlAs mole fractions Y1, Y2, C, D and Z has following relations:

$Z > Y2 > C$ and $Z > Y1 > D$ where $C > 0$, $y1 > 0$, and $D > 0$

* * * * *

UNITED STATES PATENT AND TRADEMARK OFFICE
CERTIFICATE OF CORRECTION

PATENT NO.    : 5,297,158
DATED         : March 22, 1994
INVENTOR(S)   : Hiroki Naitou et al.

It is certified that error appears in the above-identified patent and that said Letters Patent is hereby corrected as shown below:

Column 31, line 26, claim 31, after "C > O, " delete "y" and insert --Y--.

Column 7, line 8, after "that the" the formula should read --AlAs--.

Column 20, line 3, claim 2, after "a" delete "GA" and insert --Ga--.

Column 20, line 21, claim 3, beginning of equation, delete "X" and insert --x--.

Column 20, line 30, claim 3, after "layer" delete "," and insert --;-- and begin a new paragraph.

Column 20, line 38, claim 4, after "comprising:" insert the line --a $Ga_{1-x}Al_xAs$ layer as an active layer;--.

Column 21, line 21, claim 6, beginning of equation delete "X" and insert --x--.

Column 21, line 47, claim 7, beginning of equation, delete "X" and insert --x--.

UNITED STATES PATENT AND TRADEMARK OFFICE
CERTIFICATE OF CORRECTION

PATENT NO.   : 5,297,158
DATED        : March 22, 1994
INVENTOR(S)  : Hiroki Naitou et al.

It is certified that error appears in the above-identified patent and that said Letters Patent is hereby corrected as shown below:

Column 22, line 14, claim 8, after "between the" delete "As" and insert --$Ga_{1-y}Al_yAs$--.

Column 22, line 58, claim 10, beginning of equation delete "X" and insert --$x$-- and after "$XAl_xAs$" insert --layer;--.

Column 23, line 20, claim 11, beginning of equation delete "X" and insert --$x$-- and after "$XAl_xAs$" insert --layer;--.

Column 23, line 48, claim 12, beginning of equation delete "X" and insert --$x$-- and after "$XAl_xAs$" insert --layer;--.

Column 23, line 60, claim 12, before "Z" insert --wherein the AlAs mole fractions X, Y1, Y2, C, D and--.

Column 24, line 2, claim 13, in the equation, after "Ga" insert --$_1$--.

Column 24, line 4, claim 13, after "$XAl_xAs$" insert --layer;--.

UNITED STATES PATENT AND TRADEMARK OFFICE
CERTIFICATE OF CORRECTION

PATENT NO. : 5,297,158
DATED : March 22, 1994
INVENTOR(S) : Hiroki Naitou et al.

It is certified that error appears in the above-identified patent and that said Letters Patent is hereby corrected as shown below:

Column 24, line 4, claim 13, beginning of equation delete "X" and insert --$x$--.

Column 24, line 17, claim 13, after "Ga$_{1-Y}$" insert --$_1$--; and after "Al$_Y$" insert --$_1$--.

Column 24, line 18, claim 13, after "Ga$_{1-Y}$" insert --$_2$-- and after "Al$_Y$" insert --$_2$--.

Column 24, line 36, claim 14, beginning of equation delete "X" and insert --$x$-- and after equation insert --layer;--.

Column 24, line 48, claim 14, between "the" and "layer" insert --Ga$_{1-y}$Al$_y$As--.

Column 24, line 49, claim 14, first equation after "Ga$_{1-Y}$" insert --$_2$--; and after "Al$_Y$" insert --$_2$--.

Column 24, line 52, claim 14, the equation between "the" and "layer" should read --Ga$_{1-x}$Al$_x$As--.

UNITED STATES PATENT AND TRADEMARK OFFICE
CERTIFICATE OF CORRECTION

PATENT NO. : 5,297,158
DATED : March 22, 1994
INVENTOR(S) : Hiroki Naitou et al.

It is certified that error appears in the above-identified patent and that said Letters Patent is hereby corrected as shown below:

Column 24, line 67, claim 15, beginning of equation, delete "X" and insert --$x$--, and after "As" insert --layer;-- and a new paragraph.

Column 25, line 5, claim 15, in the equation after "1-Y" insert --$_1$--; and after "Al$_Y$" insert --$_1$--.

Column 25, line 9, claim 15, after "more Ga$_1$-" delete the "e" and insert --$E$--.

Column 25, line 39, claim 16, first equation after "Ga$_{1-Y}$" insert --$_1$--; and after "Al$_Y$" insert --$_1$--.

Column 25, line 39, claim 16, in the first equation after "1$_Y$A" delete the "S" and insert --s--.

Column 25, line 40, claim 16, first equation after "Ga$_{1-Y}$" insert --$_2$--; and after "Al$_Y$" insert --$_2$--.

Column 25, line 55, claim 16, delete "and"; and line 57, delete "B>X."

Column 26, line 41, claim 19, after "and" insert new paragraph.

UNITED STATES PATENT AND TRADEMARK OFFICE
CERTIFICATE OF CORRECTION

PATENT NO.   : 5,297,158
DATED        : March 22, 1994
INVENTOR(S)  : Hiroki Naitou et al.

It is certified that error appears in the above-identified patent and that said Letters Patent is hereby corrected as shown below:

Column 26, line 42, claim 19, beginning of the equation delete "E" and insert --$\underline{E}$--.

Column 28, line 24, claim 24, beginning of equation delete "Z" and insert --$\underline{z}$--.

Column 28, line 26, claim 24, in the equation after "$Ga_{1-Z}$" delete "$A_l$" and insert --Al--.

Column 28, line 66, claim 26, after "to" insert --$Ga_{1-Y1}Al_{Y1}As$ layer;-- and insert a new paragraph.

Column 29, line 10, cliam 26, in the first equation after "$Ga_{1-Y}$" insert --$_1$--; and after "$Al_Y$" insert --$_1$--.

Column 29, line 11, claim 26, in the equation after "$Ga_{1-Y}$" insert --$_2$--; and after "$Al_Y$" insert --$_2$--.

Column 29, line 12, claim 26, beginning of equation delete "Z" and insert --$\underline{z}$--.

Column 29, line 20, claim 26, after "where" equation should read --$C > 0$, $Y1 > 0$, and $D > 0$--.

UNITED STATES PATENT AND TRADEMARK OFFICE
CERTIFICATE OF CORRECTION

PATENT NO. : 5,297,158
DATED : March 22, 1994
INVENTOR(S) : Hiroki Naitou et al.

It is certified that error appears in the above-identified patent and that said Letters Patent is hereby corrected as shown below:

Column 30, line 23, claim 29, in first equation after "$Ga_{1-Y}$" insert --$_1$--; and after "$Al_Y$" insert --$_1$--.

Column 30, line 24, claim 29, in equation after "$Ga_{1-Y}$" insert --$_2$--; and after "$Al_Y$" insert --$_2$--.

Column 30, line 25, claim 29, beginning of equation delete "Z" and insert --$z$--.

Column 30, line 44, claim 30, in the equation after $Ga_{1-Y}$" delete "a" and insert --$_1$--.

Column 30, line 36, claim 29, in the equation after "C > O, " delete "y" and insert --Y--.

Column 30, line 55, claim 30, in first equation after "$Ga_{1-Y}$" insert --$_1$--; and after "$Al_Y$" insert --$_1$--..

Column 30, line 56, claim 30, in the equation after "$Ga_{1-Y}$" insert --$_2$--; and after "$Al_Y$" insert --$_2$--.

Column 30, line 66, claim 30, in the equation after "C > O, " delete "y" and insert --Y--.

UNITED STATES PATENT AND TRADEMARK OFFICE
CERTIFICATE OF CORRECTION

PATENT NO. : 5,297,158
DATED : March 22, 1994
INVENTOR(S) : Hiroki Naitou et al.

It is certified that error appears in the above-identified patent and that said Letters Patent is hereby corrected as shown below:

Column 30, line 57, claim 30, in the equation delete "Z" and insert --$z$--.

Column 31, line 26, claim 31, in the equation after "Z>Y" insert --1--.

Column 31, line 37, claim 32, after "portion;" insert new paragraph and insert --a $Ga_{1-z}Al_zAs$ layer of the other conduction type than--.

Column 31, line 46, claim 32, in the beginning of the equation delete "Z" and insert --$z$--.

Column 31, line 59, claim 32, after "C > O, " delete "y" and insert --Y--.

Column 28, line 59, claim 25, after "C > O" delete ">" and insert --, Y--.

Column 32, line 6, claim 33, beginning of equation delete "Y2" and insert --$y_2$--.

Column 32, line 20, claim 34, beginning of equation delete "X" and insert --$x$-- and after "$XAl_xAs$" insert --layer;-- and a new paragraph.

UNITED STATES PATENT AND TRADEMARK OFFICE
CERTIFICATE OF CORRECTION

PATENT NO. : 5,297,158
DATED : March 22, 1994
INVENTOR(S) : Hiroki Naitou et al.

It is certified that error appears in the above-identified patent and that said Letters Patent is hereby corrected as shown below:

Column 32, line 29, claim 34, beginning of equation delete "Y2" and insert --$Y_2$--.

Column 32, line 45, claim 35, after "applied" insert --to--.

Column 32, line 54, claim 35, beginning of equation delete "Y2" and insert --$Y_2$--.

Column 32, line 62, claim 35, after "C > 0, " delete "y" and insert --Y--.

Column 33, line 11, claim 36, beginning of equation delete "Y2" and insert --$Y_2$--.

Column 34, line 9, claim 36, in equation after "C > 0, " delete "y" and insert --Y--.

On Cover Sheet, [56] Other Publications, line 3, change "K. Oomie" to --K. Uomie--.

On Cover Sheet, [56] in Other Publications, line 5, change "H. Narto" to --H. Naito--.

UNITED STATES PATENT AND TRADEMARK OFFICE
CERTIFICATE OF CORRECTION

PATENT NO. : 5,297,158
DATED : March 22, 1994
INVENTOR(S) : Hiroki Naitou et al

It is certified that error appears in the above-indentified patent and that said Letters Patent is hereby corrected as shown below:

[57] in the Abstract, first line, after "$Ga_1$-" delete "y" and insert --y--; and after "Al" delete "y" and insert --y--.

On Cover Sheet, [57] in the Abstract, after "The AlAs" delete "mode" and insert --mole--.

Column 29, line 47, claim 27, after "C > O, " delete "y" and insert --Y--.

Column 30, line 4, claim 28, after "C > O, " delete "y" and insert --Y--.

Signed and Sealed this

Eighth Day of August, 1995

Attest:

BRUCE LEHMAN

Attesting Officer    Commissioner of Patents and Trademarks

UNITED STATES PATENT AND TRADEMARK OFFICE
CERTIFICATE OF CORRECTION

PATENT NO.    : 5,297,158
DATED         : March 22, 1994
INVENTOR(S)   : Hiroki Naitou et al.

It is certified that error appears in the above-identified patent and that said Letters Patent is hereby corrected as shown below:

On the title page, item :[73] Assignee, delete "Matsushita Electric Industrial Co., Ltd." and insert therefor --Matsushita Electronics Corporation--.

Signed and Sealed this

Twenty-seventh Day of February, 1996

Attest:

BRUCE LEHMAN

*Attesting Officer*    *Commissioner of Patents and Trademarks*